United States Patent

Burdick et al.

Patent Number: 6,148,307
Date of Patent: *Nov. 14, 2000

[54] METHOD AND SYSTEM FOR GENERATING PRODUCT PERFORMANCE HISTORY

[75] Inventors: Randy Burdick, Austin, Tex.; Richard Kittler, Sunnyvale, Calif.; F. Walter Smith, Austin, Tex.

[73] Assignee: Advanced Micro Devices, Inc., Sunnyvale, Calif.

[*] Notice: This patent is subject to a terminal disclaimer.

[21] Appl. No.: 09/195,195

[22] Filed: Nov. 18, 1998

Related U.S. Application Data

[62] Division of application No. 08/811,462, Mar. 3, 1997, Pat. No. 5,889,674, which is a continuation of application No. 08/223,348, Apr. 5, 1994, Pat. No. 5,625,816.

[51] Int. Cl.[7] ................................................. G06F 17/30
[52] U.S. Cl. .......................... 707/104; 707/10; 707/3; 709/104; 709/203
[58] Field of Search ................................ 707/104, 103, 707/10, 3; 709/104, 203

[56] References Cited

U.S. PATENT DOCUMENTS

| | | | |
|---|---|---|---|
| 5,036,479 | 7/1991 | Prednis et al. | 702/121 |
| 5,150,308 | 9/1992 | Hooper et al. | 395/500.19 |
| 5,261,094 | 11/1993 | Everson et al. | 707/201 |
| 5,325,290 | 6/1994 | Cauffman et al. | 705/34 |
| 5,333,183 | 7/1994 | Herbert | 379/112 |
| 5,438,614 | 8/1995 | Rozman et al. | 379/93.08 |
| 5,442,545 | 8/1995 | Matsui et al. | 705/29 |
| 5,537,325 | 7/1996 | Iwakiri et al. | 700/121 |
| 5,625,816 | 4/1997 | Burdick et al. | 707/103 |
| 5,706,457 | 1/1998 | Dwyer et al. | 345/349 |
| 5,890,163 | 3/1999 | Todd | 707/200 |
| 5,920,317 | 7/1999 | McDonald | 345/356 |

*Primary Examiner*—John Breene
*Assistant Examiner*—Cheryl Lewis

[57] ABSTRACT

Data in disparate formats from different data sources are reformatted into a common data format and stored in database servers serving one or more data sources such that each database server contains only a portion of the composite database. A client server and graphical user interface are provided for allowing a client to perform simple search requests on one database server, browse requests on all database servers, or serve complex search requests on one or more database servers. The client server may reformat the resultant search data into one or more specific database formats for retrieval and manipulation by a specific database program or display the information for the client. The present invention has particular application to the semiconductor manufacturing field, for tracking data produced during the processes of semiconductor manufacturing.

29 Claims, 23 Drawing Sheets

| Figure 4A | Figure 4E | Figure 4I | Figure 4M |
| --- | --- | --- | --- |
| Figure 4B | Figure 4F | Figure 4J | Figure 4N |
| Figure 4C | Figure 4G | Figure 4K | Figure 4P |
| Figure 4D | Figure 4H | Figure 4L | Figure 4Q |

METHOD AND SYSTEM FOR GENERATING PRODUCT PERFORMANCE HISTORY

This application is a divisional of application Ser. No. 08/811,462 filed Mar. 3, 1997 U.S. Pat. No. 5,889,674, which is a continuation of application Ser. No. 08/223,348 filed Apr. 5, 1994, U.S. Pat. No. 5,625,816.

TECHNICAL FIELD

The present invention relates to providing engineering data related to the manufacture of semiconductor devices in a uniform format in a centralized database and accessing that database including a graphical user interface.

BACKGROUND ART

The manufacture of semiconductor devices requires a number of discrete process steps to create a packaged semiconductor circuit device from raw semiconductor material. The various processes, from the initial melt and refinement of the semiconductor material, the slicing of the semiconductor crystal into individual wafers, the fabrication stages (etching, doping, ion implanting or the like), to the packaging and final testing of the completed device, are so different form one another and specialized that the processes may be performed in different facilities in remote regions of the globe.

For example, the process of growing and refining a large semiconductor crystal (e.g., Si, GaAs or the like) may be performed by a foundry specializing in such crystal growth techniques. The resultant crystals may then be sold directly to a semiconductor manufacturer, either as large crystals, or as wafers, sliced from a large crystal.

The semiconductor manufacturer may then slice the semiconductor crystal into wafers, if the semiconductor material is not already in wafer format,. The semiconductor manufacturer then fabricates semiconductor circuit devices (e.g., microprocessor, DRAM, ASIC or the like) on individual wafers, usually forming a number of devices on each wafer. The individual fabrication (or "FAB") processes include photolithography, ion implantation, and other associated FAB processes known in the art. Typically, the resultant semiconductor device is tested on the wafer during and after the FAB process.

Once the semiconductor devices have been fabricated and tested on the wafer, the wafer is sliced up into individual semiconductor chips and packaged. The packaging process includes mounting and wire-bonding the individual chips to chip carriers (e.g., PLCCs, DIPs, CER-DIPs, surface mount carriers or the like) and final testing of the resultant packaged semiconductor device. This packaging process is fairly labor intensive, and thus it may be desirable to perform the mounting, wire-bonding, and final testing at an offshore facility where labor rates may be cheaper. Once completed, the packaged semiconductor device may again be tested, and then labeled and shipped to customers through a distribution system.

One problem which arises in this prior art manufacturing technique, is that the various processes take place at different discrete locations. Thus, it is difficult to track a semiconductor device through the fabrication process, from single crystal to finished product. Such tracking may be necessary for quality control purposes in order to determine the causes of production problems which may result in low yields or circuit defects.

In present fabrication facilities, individual fabrication machines or computer aided manufacturing systems (CAM systems) may provide data regarding operating conditions during the fabrication process. Some of these data are intrinsic data, for example, lot numbers, device model numbers or the like. Other data may be extrinsic data, such as production test data, production conditions, or the like. In the various processes, the various lot numbers may be changed, thus making it difficult for a production engineer to track down and solve difficulties in the production process.

For example, a semiconductor crystal or wafers may be assigned a manufacturer's lot number and shipped to a FAB facility. The FAB facility may in turn divide these wafers into different lots of 25 to 50 wafers, each assigned a new and different lot number. Each of these new lots of wafers may be used in the manufacture of a particular model semiconductor device. These lots may further comprise wafers commingled from other received lots of semiconductor wafers. During different process steps in the FAB facility, new lot numbers may be assigned to a wafer of group of wafers.

In the final assembly facility, the wafers are sliced up into chips, which may be assigned yet again new lot numbers. Through the production process testing and manufacturing steps are performed, generating data for each semiconductor device. If a problem arises in the manufacture of the semiconductor, for example a low yield of usable semiconductor devices, a production engineer may wish to track the semiconductor devices to determine why the production problem existed, correct the problem if necessary, and intercept other semiconductor devices similarly affected before performing additional process steps or shipping the product to the consumer.

Some efforts have been made through CAM systems to set up shop floor control systems (e.g. WorkStream™ or the like) and gather data on semiconductor devices during manufacturing. However, in such a shop floor control system, the collection of engineering data has been a by-product of the need to manage the inventory in the factory and manage the factory itself.

Unfortunately, in the prior art, no such system existed for effectively tracking engineering data from the various facilities. Manually tracking engineering data is hampered by several problems. First, the multiple facilities, if provided with computerized data acquisition systems (e.g., CAM or the like) may utilize different systems within the facility, and each facility may have systems different from the other. Thus, the computer systems may be incompatible and not effectively interfaced with one another. In addition, the different systems generally collect data in different formats, and thus data from one system cannot readily be compared or merged with data from another system. Further, since different lot numbers may be assigned at different steps in the manufacturing process, it may be difficult for an engineer to effectively track a particular chip, group of chips, wafer, or group of wafers back though the process steps. Since many of these CAM processes utilize computer systems dedicated to the manufacturing process, the systems may be unsuitable or too engaged to be used for manually tracking the production process of a semiconductor device.

In addition to improving the production process, the ability to track production data for a semiconductor device may also be useful to a semiconductor manufacturer in enhancing the value of the semiconductor to the consumer. For many critical applications (e.g., military or the like), the consumer may require assurances that the quality control of the semiconductor device can be effectively traced at each step. Further, the consumer may require that each semiconductor be provided with its "lineage," including the data generated in the manufacture and testing of the semiconductor device.

DISCLOSURE OF THE INVENTION

A system for storing and retrieving data comprises a network for transmitting and receiving data and at least one input system for inputting data in at least a first format. A reformatter receives the data and reformats the data into a predetermined standard format. A database coupled to the network stores the reformatted data, A loader loads the reformatted data into the database. At least one client workstation is provided, coupled to the network, for receiving database search requests. A front end server, coupled to the network, receives the database search requests and processes the search requests, querying the database, receiving reformatted data from the database, and outputting the reformatted data.

It is an object of the present invention to provide a global database of manufacturing data which may be readily accessed by a reliability engineer to provide product performance history for a particular manufactured product.

It is a further object of the present invention to provide a standardized data format for reformatting disparate types and forms of data into a common format which may be stored in a global database.

It is a further object of the present invention to provide a method and system for tracking a manufactured product or group of manufactured products through a manufacturing process comprising a series of manufacturing steps performed at different physical locations.

BRIEF DESCRIPTION OF DRAWINGS

FIG. 4 is a diagram showing the relationship between the sections of the physical data model shown in FIGS. 4A, 4B, 4C, 4D, 4E, 4F, 4G, 4H, 4I, 4J, 4K, 4L, 4M, 4N, 4O, 4P and 4Q.

BEST MODE FOR CARRYING OUT THE INVENTION

Figure 1:
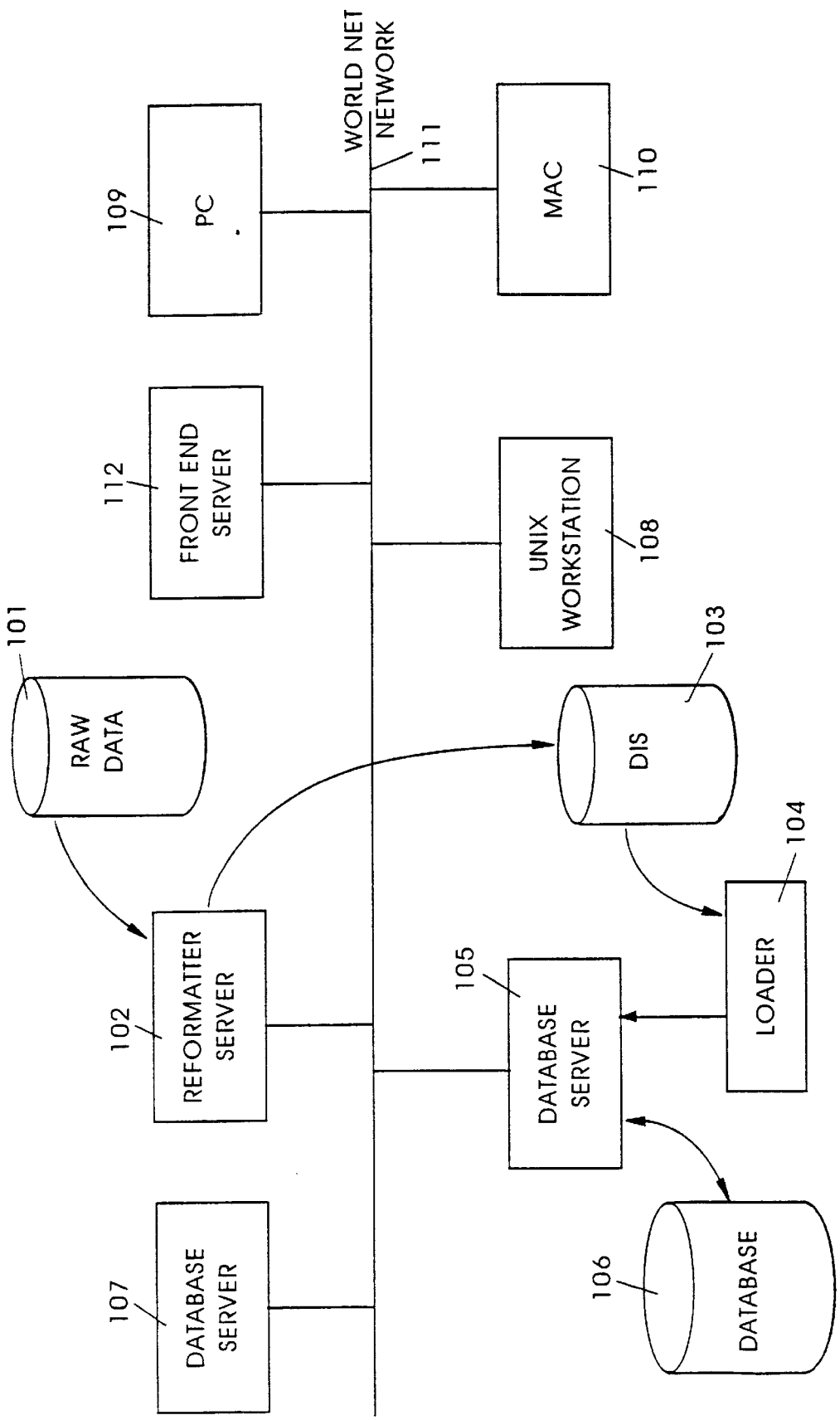
FIG. 1 is a block diagram of the database system of the present invention.

In FIG. 1, the database system of the present invention is composed of various distributed elements connected together by a common network designated as worldnet network 111. Worldnet network 111 may comprise, for example, any of many known computer system networks which may be accessed via telephone link, microwave relay, satellite link or the like. As the name implies, worldnet network may provide a data link between system elements located throughout the world. Alternatively, worldnet network may comprise a network more limited in scope, including a local area network (LAN) for use within one plant location, without departing from the spirit and scope of the invention. In the preferred embodiment, worldnet network comprises a global communications network which allows systems elements to be located at various locations throughout the world.

Raw data 101 is generated at or within a particular plant facility. As discussed previously, semiconductor circuit manufacturing may be performed in several steps, including crystal growth, wafer sawing, so-called FAB or fabrication, testing, packaging and the like. Raw data 101 may comprise raw data produced from any one or a combination of these steps. Further, raw data 101 may comprise test data from testing performed before, during or after any one of these process steps. For the sake of illustration, only one group of raw data 101 is shown. However, other groups of raw data 101 and associated reformatter servers 102 may be provided for data generated from each process step or groups of steps.

Raw data 101 may comprise, for example, data generated from a WorkStream™ CAM system. This data may include manually keyed data generated by production employees or production engineers and entered at the shop floor into a WorkStream™ system. The data may also include data automatically loaded by the WorkStream™ system during the manufacturing process from the manufacturing equipment. These data may include, for example, temperature and pressure data describing the manufacturing process during, e.g., an etching operation. Such data is referred to as extrinsic data. So-called intrinsic data (e.g., lot number, date, time, machine number or the like) may also be manually or automatically entered into the WorkStream™ system.

Raw data 101 may be in one of a number of formats. Typically, the format of the data has been previously determined when the CAM or data acquisition system has been installed. Thus, the data format has already been determined in accordance with previously determined needs. Since the needs of the process engineers at each process step differ, it is generally the case that raw data 101 may be in one of a number of different formats. Similarly, since a number of data sources or manufacturers of data acquisition systems may differ, it is generally more often the case that raw data 101 may be in one of a number of different formats.

Reformatter server 102 is provided to reformat raw data 101 into a standardized data format known as Data Input Standard or DIS. Raw data 101 is fed to a reformatter server which reformats this data into DIS format, which will be discussed below in conjunction with FIGS. 4A–4D. Raw data 101 may be loaded into reformatter server 102 by means of data tape or disk, or through a local area network (LAN) at the data source. Each data source may be provided with a reformatter server, or in the alternative, a reformatter server may serve a number of data sources. In addition, reformatter server 102 may be fed with raw data 101 through worldnet network 111, although generally the cost of doing so may be somewhat prohibitive.

Reformatter server 102 may comprise a software program run on a computer or computer system. For example, reformatter server 102 may comprise a UNIX™ based computer system or a DOS based computer or computer network. In the preferred embodiment, the reformatter server may comprises a software program run on a general purpose UNIX™ based computer coupled to worldnet 111.

If the semiconductor crystals or wafers are purchased from an outside foundry, production data from that foundry may be provided (via contract arrangement with that foundry) in the DIS format or as raw data for input into the database system of the present invention. Similarly, data for other purchased components may be entered into the database system. This outside data may be provided on tape or disc and may be loaded in the DIS format into a database server 104 via loader 104. Alternatively, an outside supplier may be able to download such data electronically via a commercial network (e.g., Compuserve™) or via a telephone modem, private network or the like, or by access granted by the manufacture through worldnet network 111.

If the outside data is not in the DIS format, a reformatter server 102 may be provided or adapted to reformat the outside data into the DIS format for inclusion into the database system. If the data in electronic format cannot be obtained from the supplier or foundry, selected production data for the components (e.g., source, lot number, or other intrinsic or extrinsic data) may be manually keyed into the database system of the present invention.

As discussed above, raw data 101 may comprise data from a WorkStream™ CAM system generated at one manufacturing facility, such as a so-called FAB facility. At the FAB facility, a reformatter server 102 may be provided, interfaced with the WorkStream™ CAM system by means of a local area network (LAN) or the like. Periodically, raw data 101 is fed to reformatter server 102 which reformats the data into DIS format to produce DIS data 103. Once reformatted, the data in DIS format may then be available through worldnet network 111.

Once raw data 101 has been reformatted into DIS data 103 by reformatter server 102, the DIS data is loaded, via loader 104 into local database server 105 to produce database 106.

A plurality of database servers 105, 107 may be provided. For the purposes of illustration, local database server 105 represents a database server for a particular client location, whereas database server 107 represents all other database servers within the database system. Typically, each data source (e.g., manufacturing plant or testing facility) may be provided with one or more database servers 107. Thus, the entirety of the database 106 may be provided, not in any one database server, but rather spread out through a number of database servers logically joined and connected through worldnet network 111. In the preferred embodiment, each manufacturing facility may have several database servers 107.

For example, each department within a manufacturing facility may be provided with its own local database server 105. Thus, a particular department within a processing facility may supply (and pay for) its own portion of the database system. Overall costs of the database system may be paid for by each department using a subscription system similar to that used in on-line subscription systems (e.g., Compuserve™ or the like). In a similar manner, the present invention may also be applied to a commercial database systems where each subscriber provides its own portion of an overall database.

In the preferred embodiment, loader 104 may comprise a software program run on the same computer or computer system as database server 105. Preferably, database server 105 is a UNIX™ based server connected to worldnet network 111. Alternatively, one centralized loader 104 may be provided to load data into any portion of database 106 in database servers 105, 107 as determined by the content of DIS data 103. However, in the preferred embodiment, a number of loaders 104 are used, each optimized to load data into certain regions of database 106 depending on data type.

Since the primary purpose of the WorkStream™ system is to manage and control the manufacturing operation, raw data 101 is loaded only periodically via reformatter server 102. The period between the loading of the data may be determined generally by the engineering needs for that data. For example, so-called structural information, such as product lines (e.g., model designations or the like) may change only on a yearly basis. Other data, such as intrinsic and extrinsic data, may change on a daily or hourly basis as individual semiconductor devices pass through various process steps. Thus, the range for the time period between successive reformatting and loading of raw data may vary from an hourly to a yearly basis.

Distributing database 106 over a number of database servers 105, 107 on worldnet network 111 provides a number of advantages over prior art centralized databases. For example, as discussed above, the task of reformatting and loading raw data 101 can be more easily performed by a series of decentralized reformatter servers 107 and loaders 104 located in proximity to each source of raw data 101. Further, since reformatting and loading is performed locally, the amount of data flow through the worldnet network 111 may be greatly reduced. In addition, the plurality of database servers 105, 107 provides for system redundancy, such that if one database server is disabled, database 106 is not entirely disabled. Finally, since most database search or trace requests will be directed towards data contained in a local database server 105, the speed and response time of database 106 are improved.

Access to database 106 is provided through one of a number of client servers located on worldnet network 111. The term "client," as used in this application, refers to an end user of the database system (e.g., production engineer or the like). The client server may take the form of a graphical user interface (GUI) provided in an IBM™ compatible personal computer (PC) 109, an Apple™ MacIntosh™ computer 110 or UNIX™ Workstation 108 coupled to worldnet network 111. Collectively, client servers 108, 109, and 110 and local database server 105 may be referred to as "front-end" servers, and reformatter server 102 and loader 104 may be referred to as "backend" servers.

Client servers 108, 109, 110 are provided with a graphical user interface (GUI) program which allows the client to access database 106. Access to database 106 may take one of several forms. As discussed above, database 106 is decentralized into a number of database servers 105, 107. A production engineer or client within a particular facility, for example, the FAB facility, may have direct on-line access to that portion of database 106 contained within a database server, for example, local database server 105, located within that facility.

Most requests by a client will be related to that portion of the database 106 contained within that client's local database server. Thus, for example, a production engineer in a FAB facility may be most interested in data generated within that facility. Since that portion of database 106 is located within the local database server 105, information requests entered into client server 108, 109 or 110 may be quickly and easily handled.

The next type of data request that may be entered by a client into a client server 108, 109 or 110 is the so-called "browse" request. Such requests are not detailed data search requests, but nevertheless may require data from one of a number of database servers 105, 107 containing database 106. These browse requests are made by the client from client server 108, 109, or 110 and transmitted through worldnet network 111. Worldnet network 111 may access any one of database servers 105, 107 and request browse data. Examples of browse data include specific requests concerning lot numbers or data from a specific lot number or the like.

Figure 3:
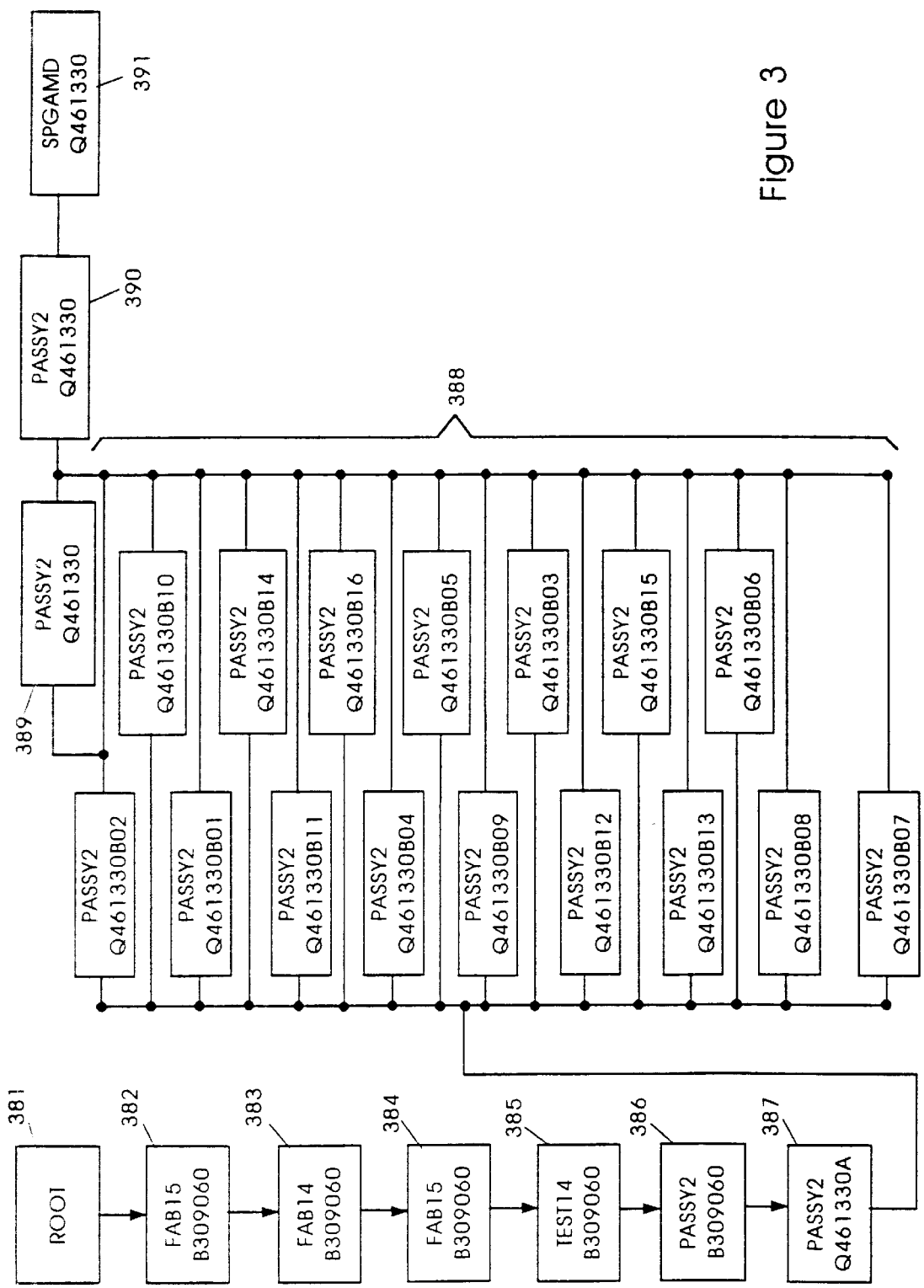
FIG. 3 is a sample product performance history generated for a sample lot of semiconductors using the database system of the present invention.

Other request may be much more complex. For example, a production engineer attempting to troubleshoot a particular production problem, may enter a complex data analysis request. Such a request for example, may comprise a complete genealogy from a particular chip, the results of which are shown in FIG. 3. Other requests may include, e.g., a search request for all lot numbers of chips processed by a particular machine or plant during a particular time period. For example, if a production engineer determined that a particular fabrication process has malfunctioned for a particular time period, the engineer may wish to trace all products which were processed during that time period and intercept those products before further processing is performed or the product is shipped to customers.

These complex search requests may require a relatively large amount of time to complete and thus may be entered as off-line requests to be performed as background jobs. Through the GUI in client server 108, 109, or 110, the client enters the search request using logical field operators as is well known in the art. Front end server 112, coupled to worldnet 111, receives and processes these complex requests. Database servers 105, 107 may operate using, for example, Oracle™ database library software, which provides an operating system and search software for a database server 105, 107. A client's local database server 105 then processes the search request, requesting information from other database servers 107 as necessary. Through the GUI in client server 108, 109, or 110, the client may be notified when the search request has been complete.

FIG. 3 shows an example of a result of a complex search request, in this instance, a genealogy of a semiconductor device. The GUI of the present invention allows the user to view this genealogy in graphical form on a CRT screen, or print the genealogy on a suitably equipped printer. FIG. 3 shows the series of process steps followed by a lot of semiconductor devices through various process steps. The semiconductor devices begin as raw semiconductor wafer material, here shown with the sample lot number "ROOT" in step 381. Steps 382–384 show the fabrication steps in the processing of the wafer, whereas step 385 shows the initial testing stage of the devices. Assembly steps 386–390 show the various steps taken in the assembly process. Not all of the original semiconductor devices are assembled in the same steps. Different devices may be assembled in different machines, different plants, or into different chip carriers. The final step 391 shows the manufacturing lot number assigned to the finished device. Throughout the manufacturing process, the lot numbers assigned to the semiconductors may change at different steps. The genealogy shown in FIG. 3 allows a production engineer to make further inquiries, if necessary, regarding manufacturing conditions or the like, with respect to a particular lot number or step in the process.

The GUI of the present invention provides the client with a variety of options with regard to the format of retrieved data from a complex search request. The GUI or the present invention may allow the client to view of browse the produced data, or may reformat that data into one of a number of formats corresponding to commercially available database programs (e.g., Lotus 1-2-3™, Paradox™, Excel™, RS1™, SAS™, or the like). Thus, engineers within a particular production facility or department may download information from database 106 and reformat this information into other database programs to meet pre-existing program or project needs.

Figure 2:
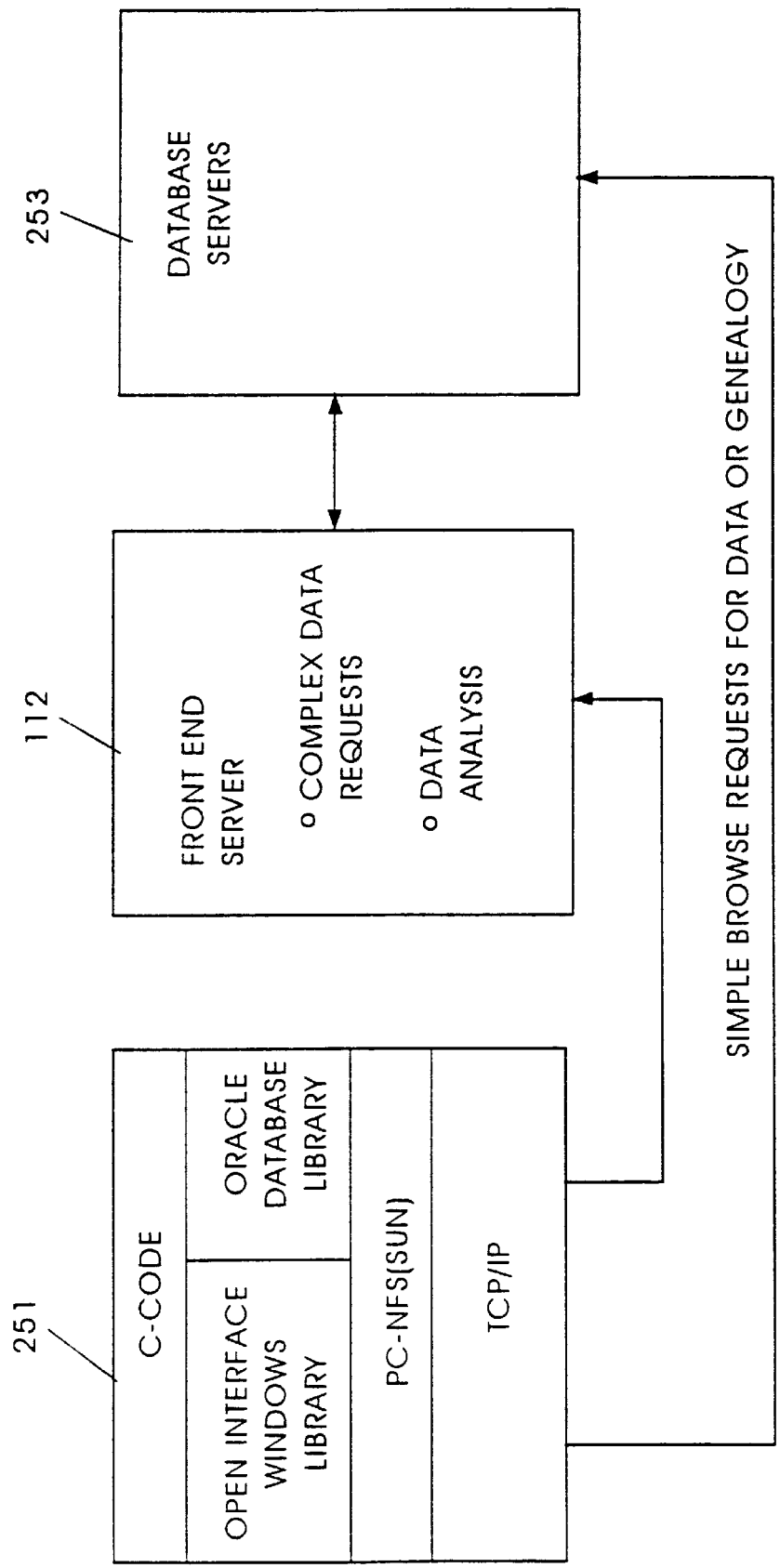
FIG. 2 is a block diagram of the software structure and data flow between client and database servers of the present invention.

FIG. 2 is a block diagram of the software structure and data flow between client and database servers of the present invention. Client server 251 may comprise, for example, PC 109 of FIG. 1. However client server 251 may also be substituted by client servers 108 or 110 shown in FIG. 1 without departing from the spirit or scope of the invention. Client server 251 contains a package of software programs which cooperate to provide a graphical user interface (GUI) for client requests. PC-NFS, a product of SUN Microsystems, comprises a software package which allows a DOS based PC to operate as a UNIX™ workstation. The OpenInterface™ Windows™ library, a product of Microsoft™ corporation, provides a standardized set of GUI interface routines. The ORACLE™ database library provides the data search and retrieval routines for accessing database 106. Custom written C-code provides a GUI incorporating elements of OpenInterface™ and ORACLE™. TCP/IP is a network protocol recognition software which allows the client server to run on an Ethernet™ system.

The front end server 112 may comprise a software program operating in a general purpose UNIX™ based computer coupled to worldnet 111. Database servers 253 in FIG. 2 represent collectively all database servers 105, 107 in the database 106. Browse requests entered into client server 251 are applied directly to database servers 253, bypassing front end server 112. Since the browse requests are directed towards specific fields of data and do not require large amounts of data to be transferred, these requests can be quickly handled by database servers 253 and transferred to client server 251 through worldnet 111 (not shown).

Front end server 112 may comprise a large, general purpose UNIX™ based computer, or alternately may comprise the same computer as local database server 105. Complex database requests and data analysis are processed by front-end server 112. Complex database requests generally ask for data from more than one portion of the process and may require accessing data from more than one region of database 106. Thus, complex requests may be entered into client server 251 and processed by front end server 112 as a so-called "background" job. Once the complex request has been entered into client server 251, front end server 112 processes the request, freeing client server 251 for further browsing or other tasks. As discussed above, client server 251 may comprise any of client servers 108, 109, or 110 (i.e., UNIX, DOS-PC or MAC). As such, the computer housing the software for client server 251 may not be dedicated to the client server task, but may also be used for other tasks commonly assigned to such PCs or workstations.

Front end server 112 may generate a query status file, which is periodically updated with the status of a complex search request. This file may be accessed by the client through client server 251 to determine the status of his complex request. For example, the client may wish to determine whether the complex request has been completed, or at what stage the complex request has reached (i.e., percent completed). Further, in some instances, a client may inadvertently issue a complex request which causes the front end server to "hang." Such a request, for example, may ask for an incompatible combination of data operators (i.e., searching a numerical field for a text operand). The client may then issue commands through client server 251 to front end server 112 to terminate the complex request.

In addition, the front end server may be interfaced with, or provide an E-mail type system to notify clients of completed search requests or to allow communication between different clients in the system. Further, the front end server may "deliver" the completed search result in a desired format (e.g., compatible with a particular print format or in a format compatible with a commercial database program) to a location determined by the client. In addition, the front end server may (if selected by the client in making the complex request) provide a log of the process of the complex request, for example, noting any errors or abnormalities in the processing of the search request. For example, if some requested data is unavailable due to a database serving being down or inaccessible, the front end server may note that unavailability of that data and continue the complex request.

To enter a complex request, the client server creates a query request file using information entered by the client through the GUI. The query request file includes the name of query definition file which contains the logical search request. The query request file also includes and the destination environment and node (i.e., format and file location). Front end server 112 parses the query request file and scans the query definition to determine which database servers 106 are being referenced. Front end server 112 then partitions the main query definition file into "child" files each of which references one database server 106. Front end server 112 may then run a request for each child definition file using one of two methods.

In the first method, which is the preferred embodiment of the present invention, a search request is generated and run against the database. The results are copied out to a series of temporary ASCII files. These row-wise ASCII files are then processed to do any further aggregation as required as well as a final transpose. the transposed data file is then delivered to the destination environment.

The second and alternative method of the present invention generates the search request and feeds it into a dynamic search processor program which is responsible for dynamically processing the search request, transposing the data into an internal version of the final data table, and performing any required replication of aggregation. This second technique, while possibly quicker that the preferred embodiment, requires more computer resources and code to process.

FIG. 4 is a diagram showing the relationship between the sections of the physical data model shown in FIGS. 4A, 4B, 4C and 4D. A detailed description of each of the elements of the data model shown in FIGS. 4A–4D is detailed in the Appendix attached hereto.

Figure 4A:
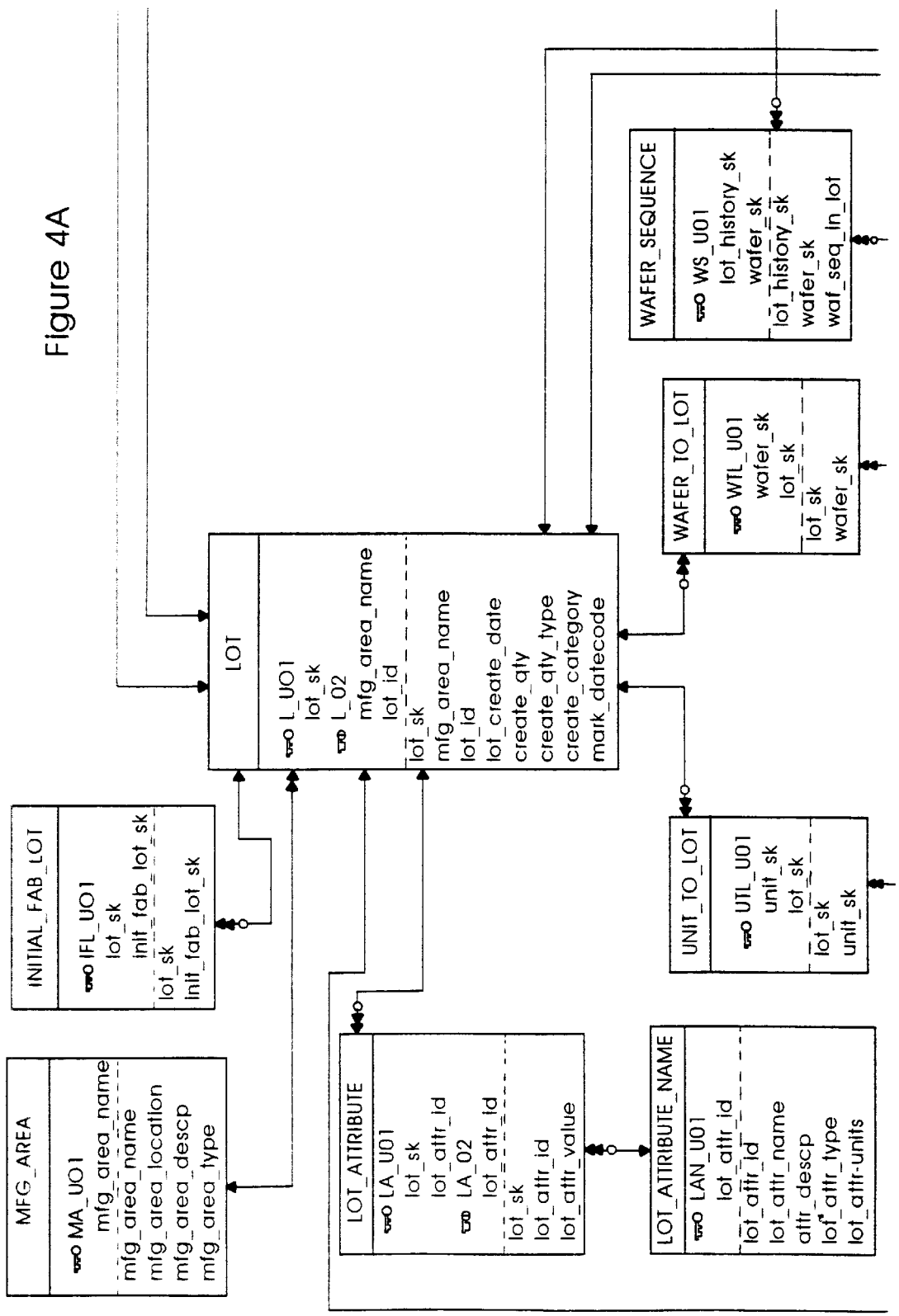
FIGS. 4A, 4B, 4E and 4F are a block diagram of the upper left hand corner of the physical data model of the present invention.
Figure 4B:
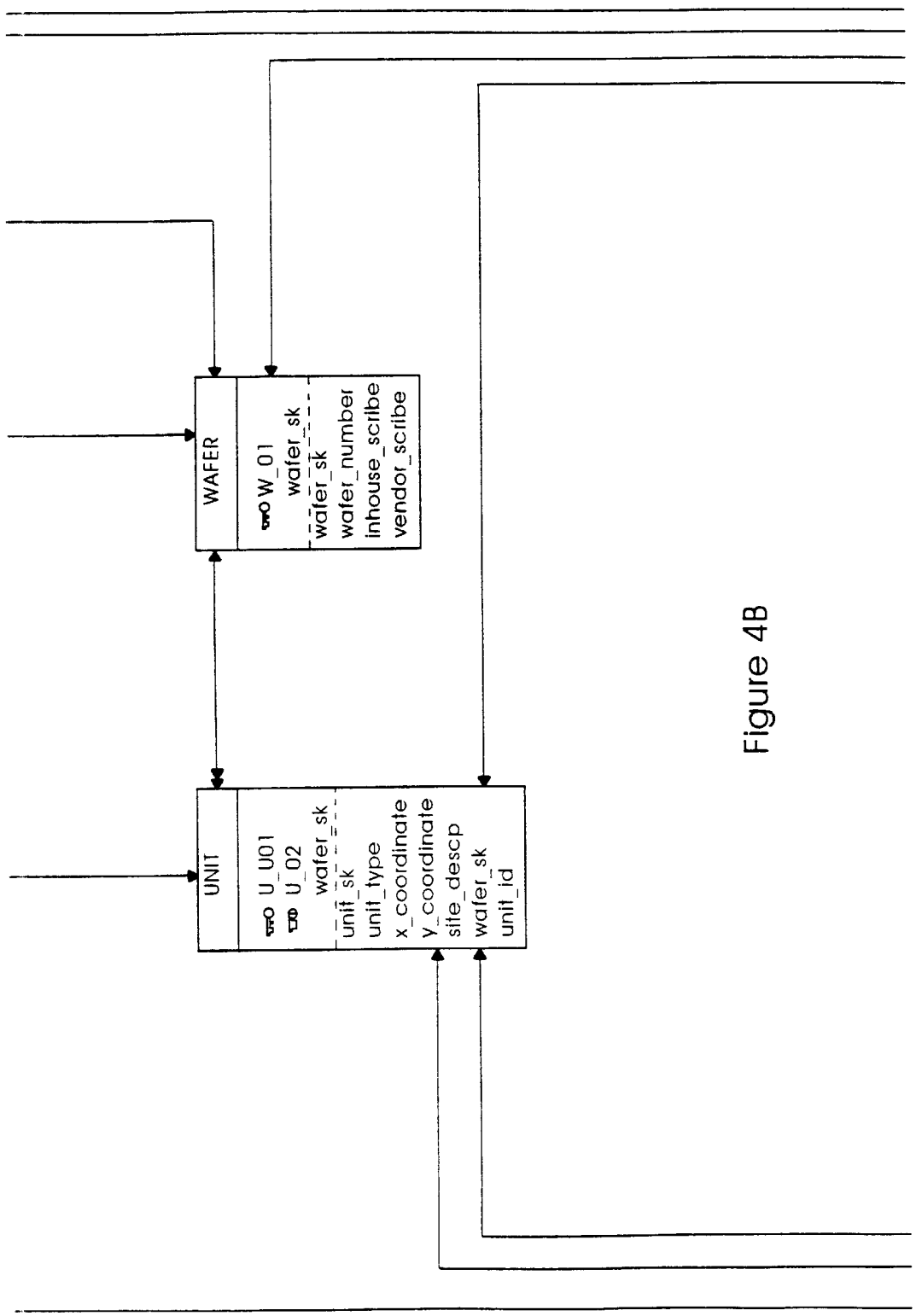
Figure 4C:
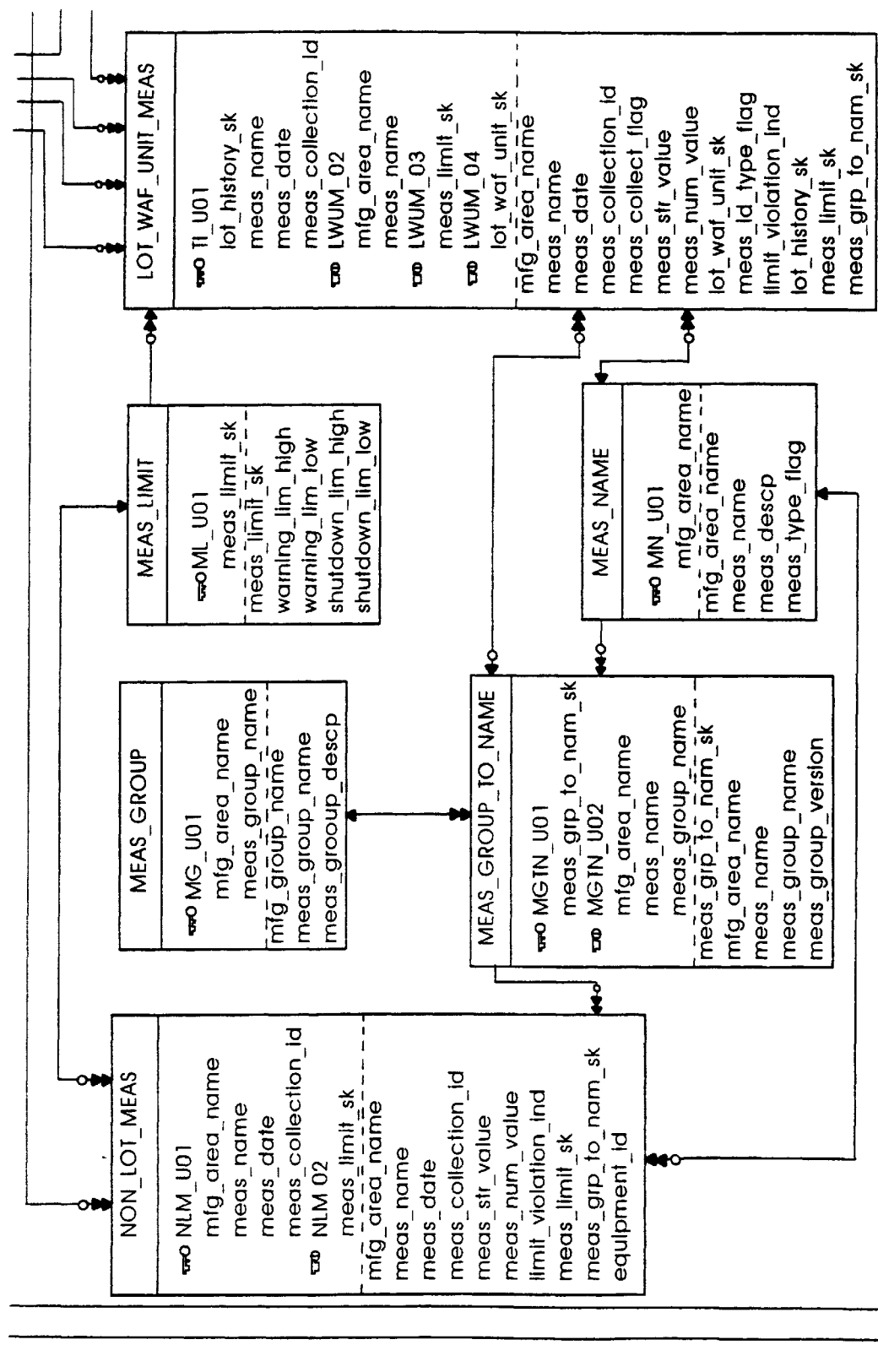
FIGS. 4C, 4D, 4G and 4H are a block diagram of the lower left hand corner of the physical data model of the present invention.
Figure 4D:
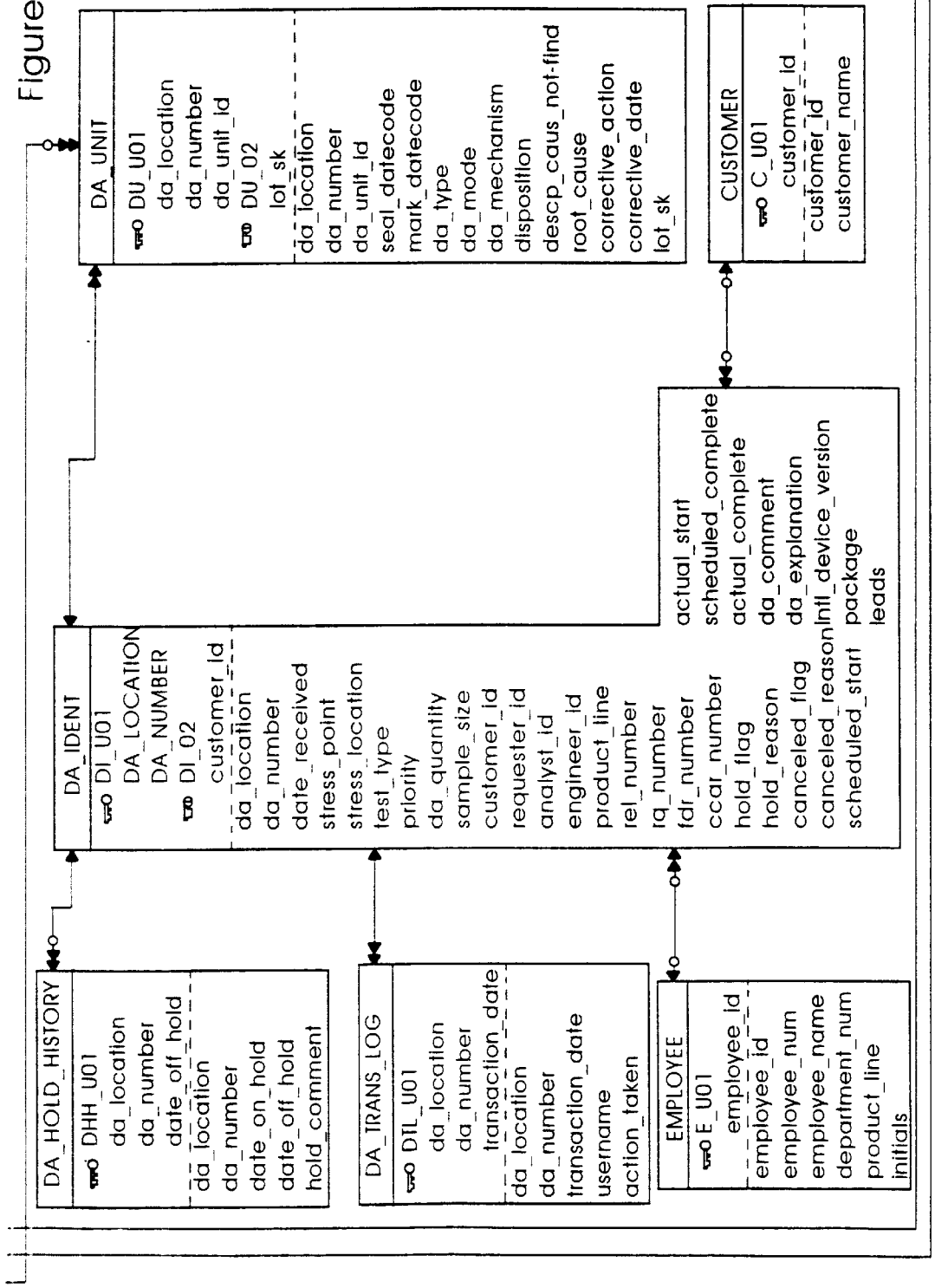
Figure 4E:
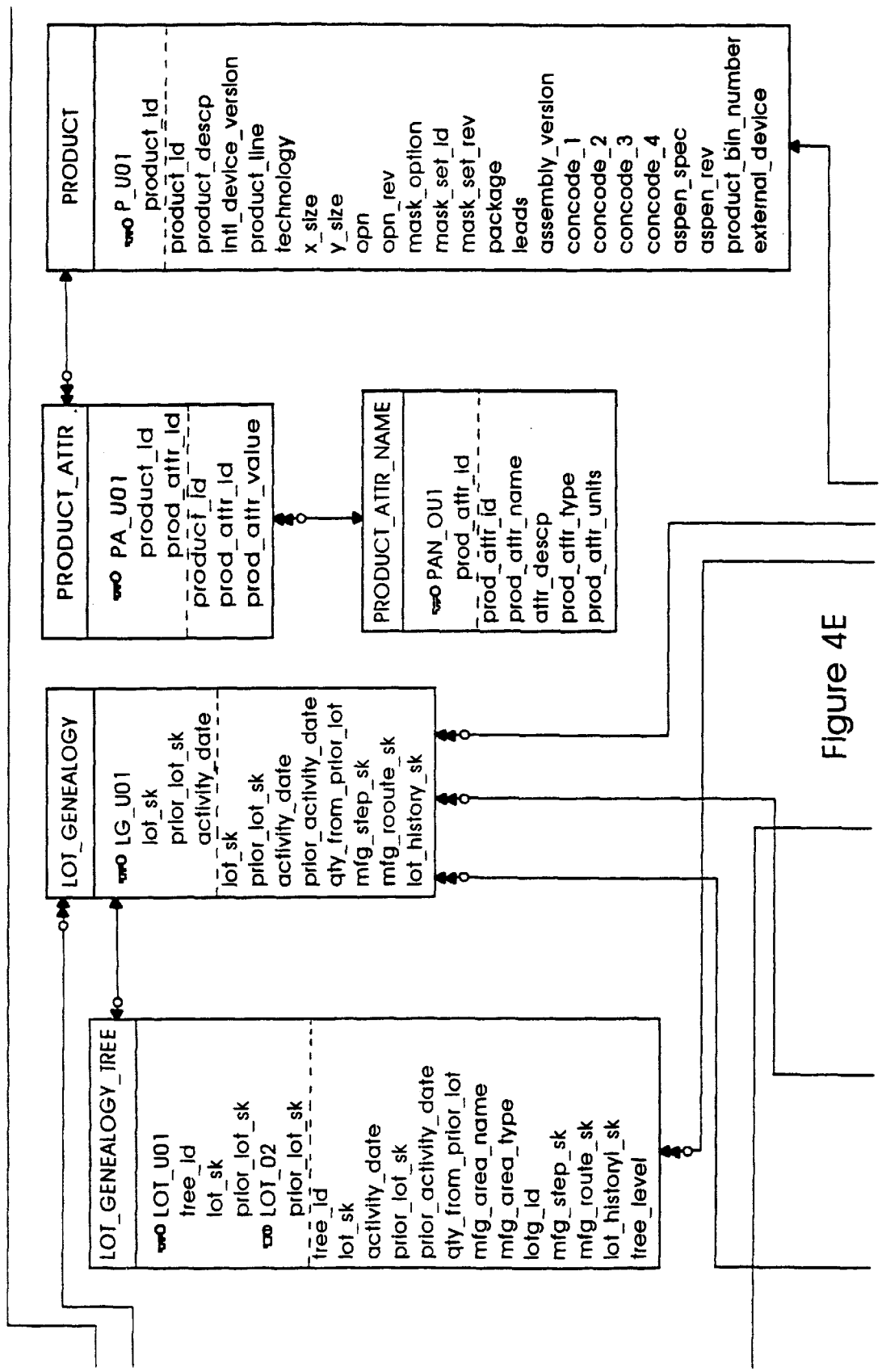
Figure 4F:
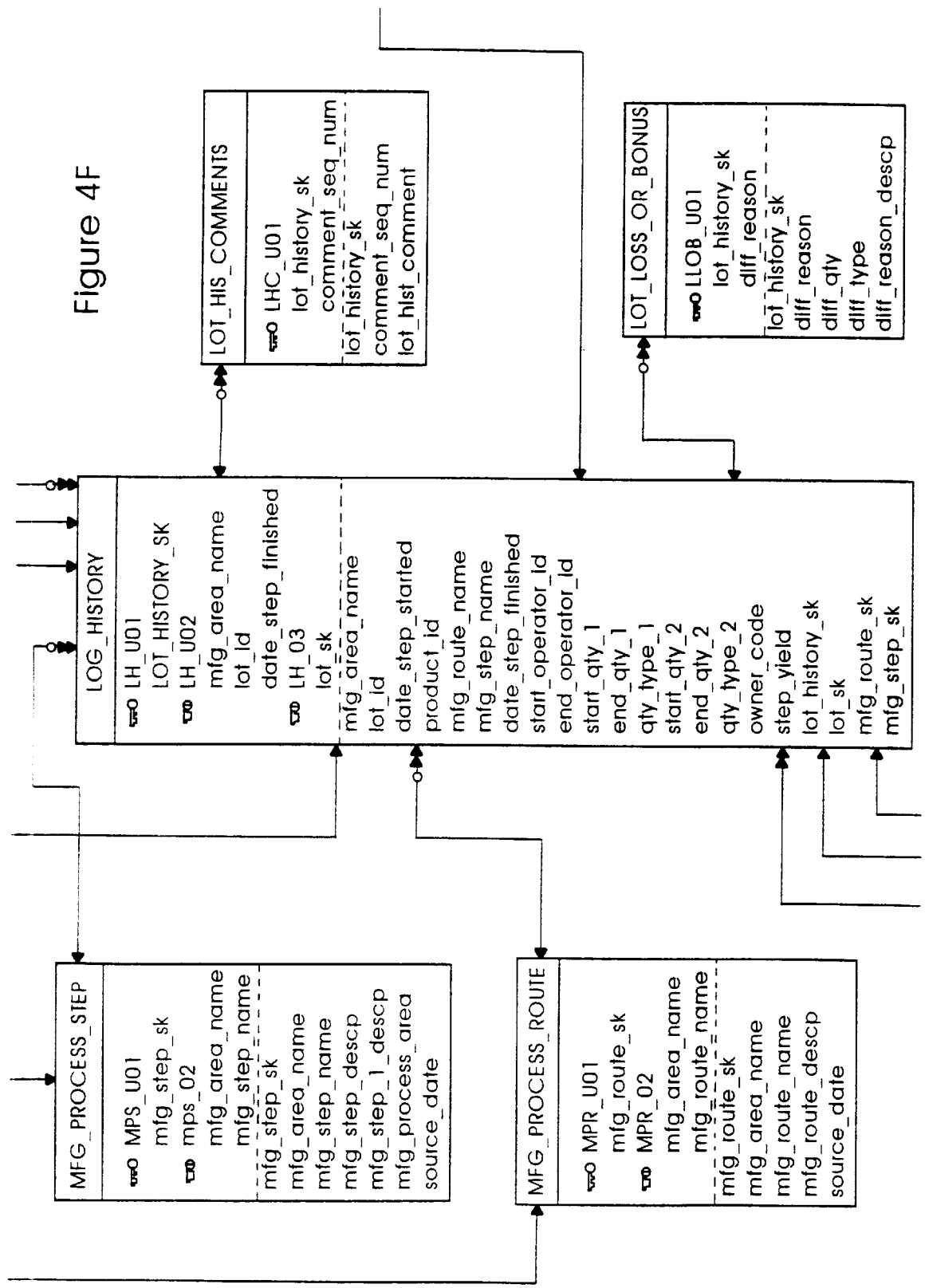
Figure 4G:
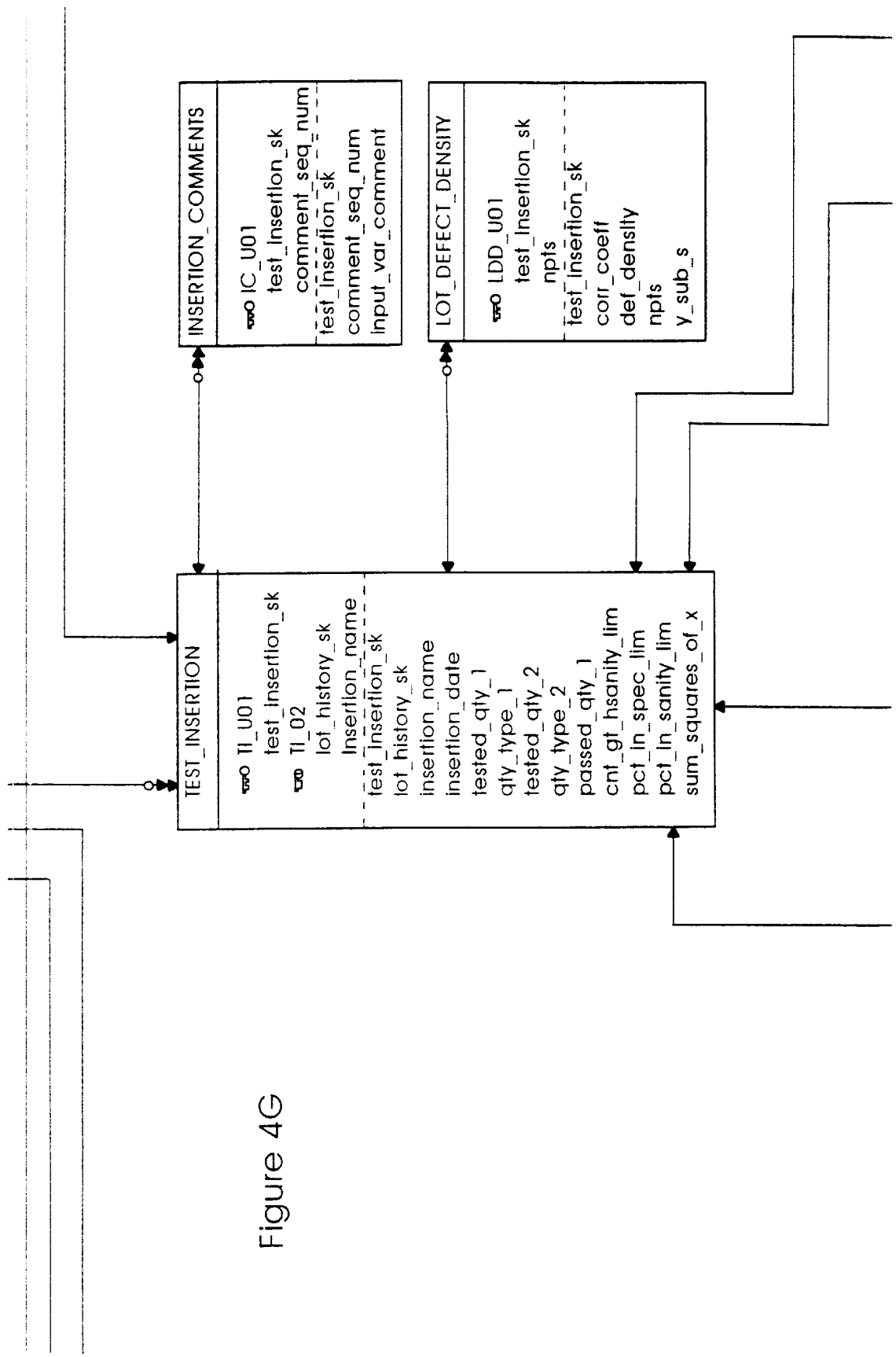
Figure 4H:
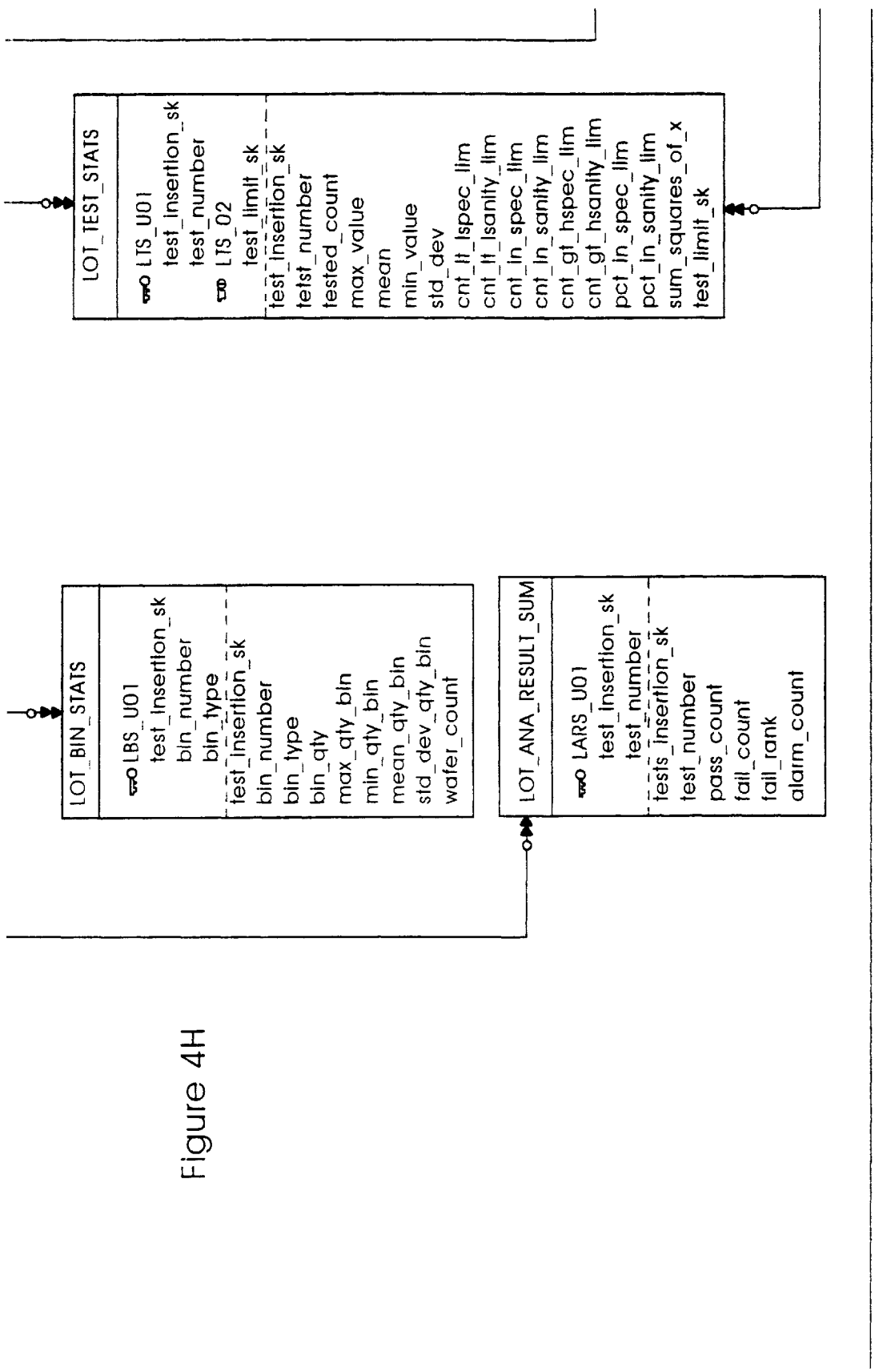
Figure 4I:
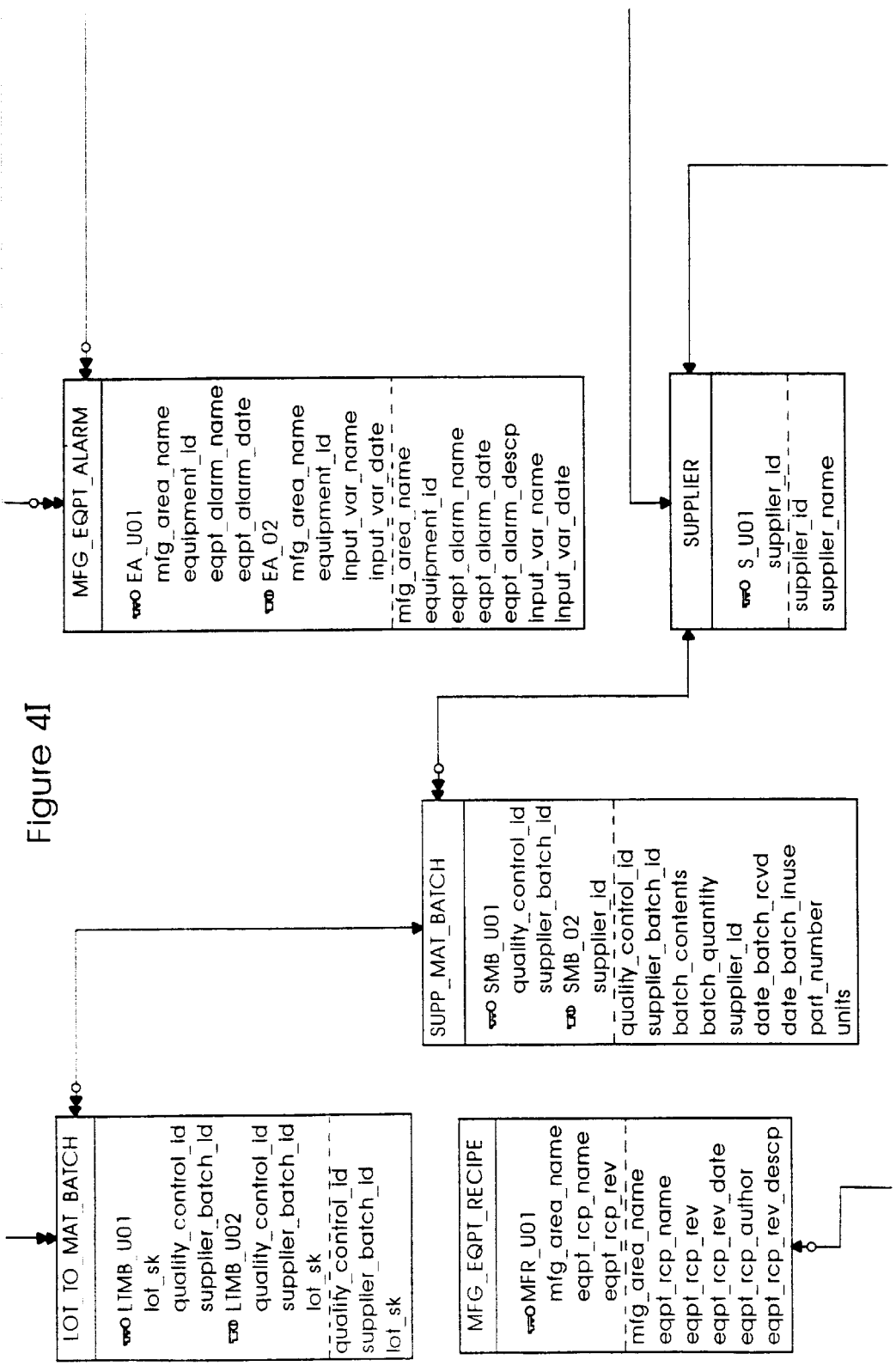
FIGS. 4I, 4J, 4M and 4N are a block diagram of the upper right hand corner of the physical data model of the present invention.
Figure 4J:
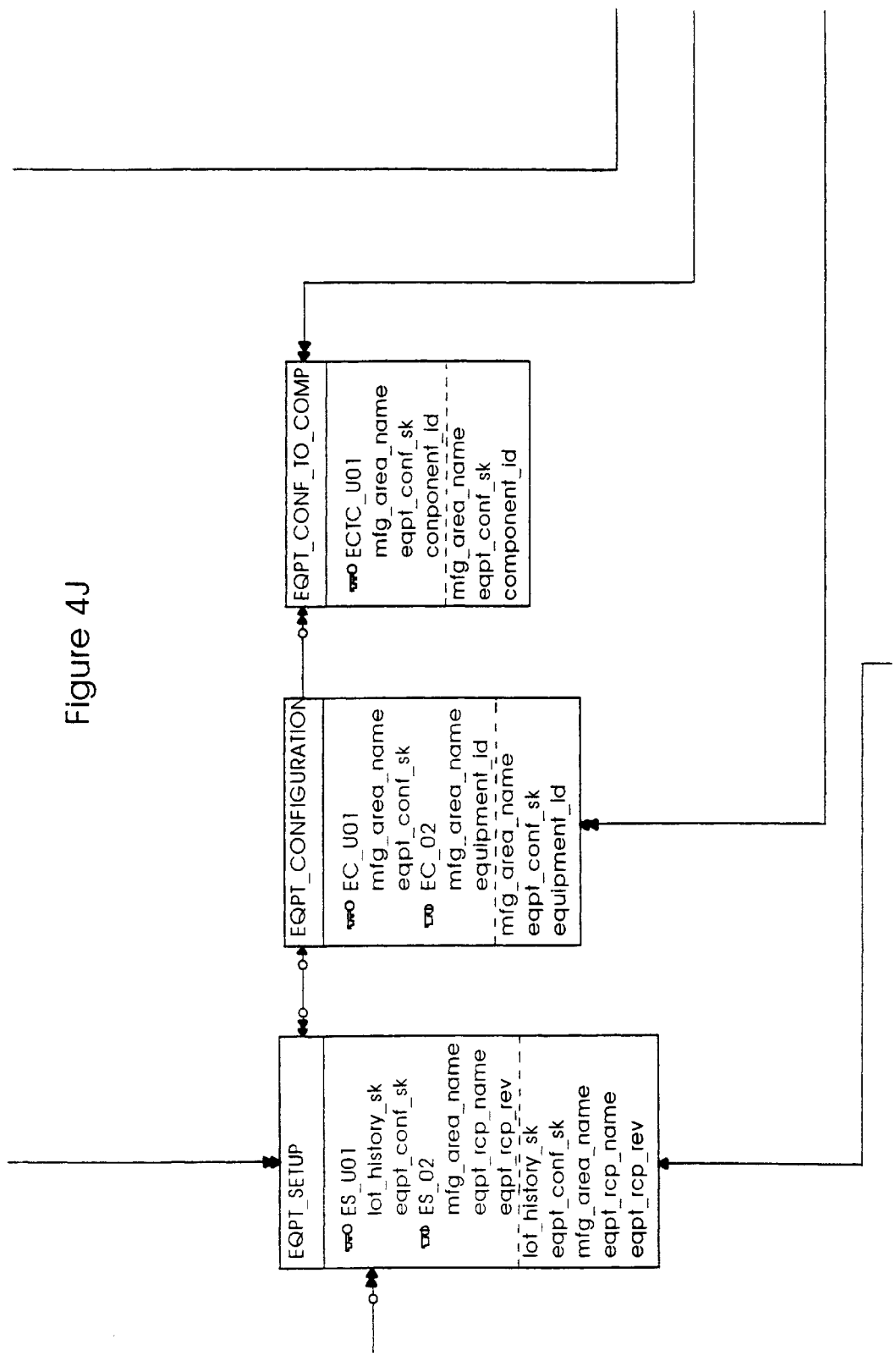
Figure 4K:
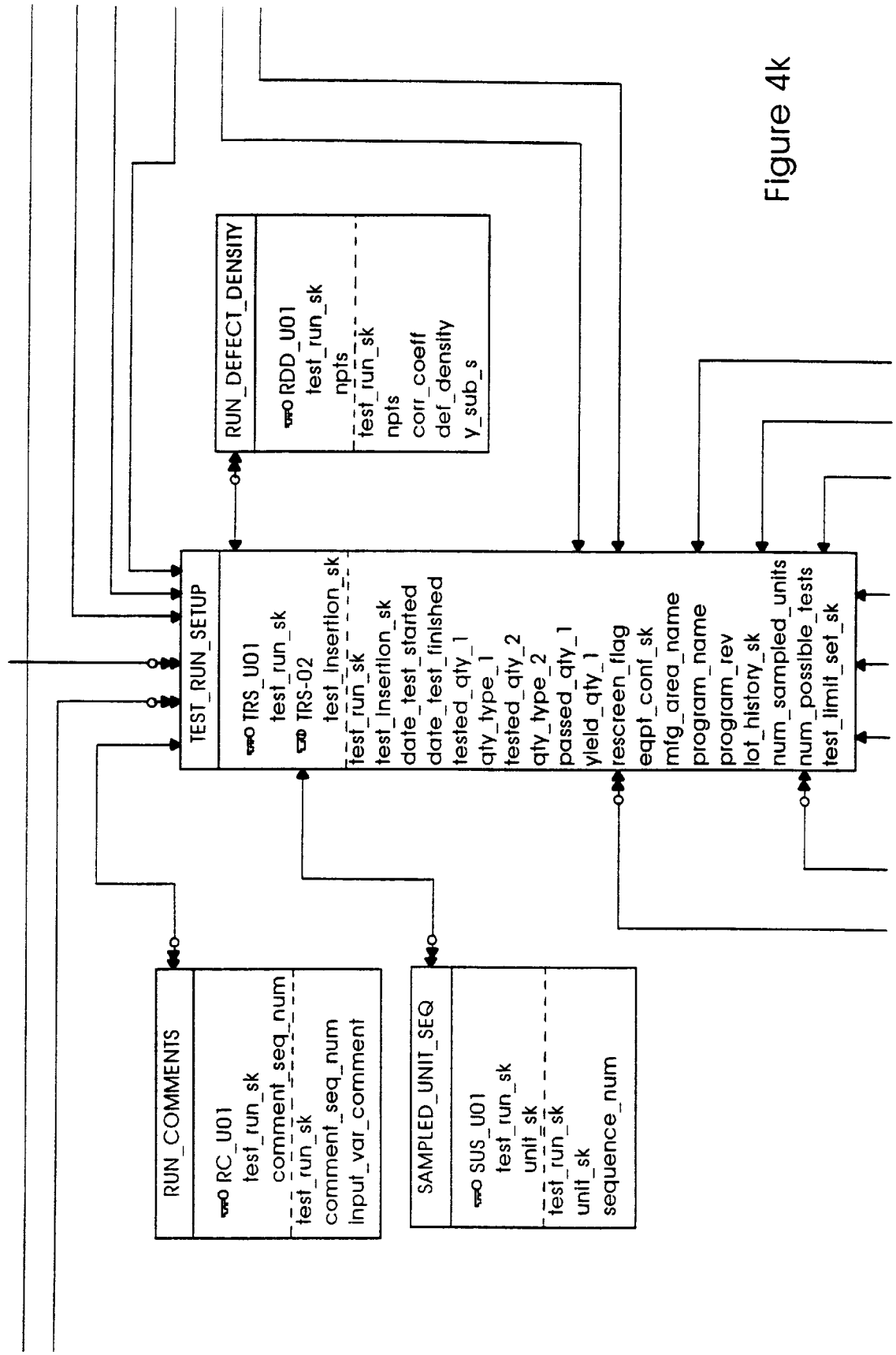
FIGS. 4K, 4L, 4P and 4Q area block diagram of the lower right hand corner of the physical data model of the present invention.
Figure 4L:
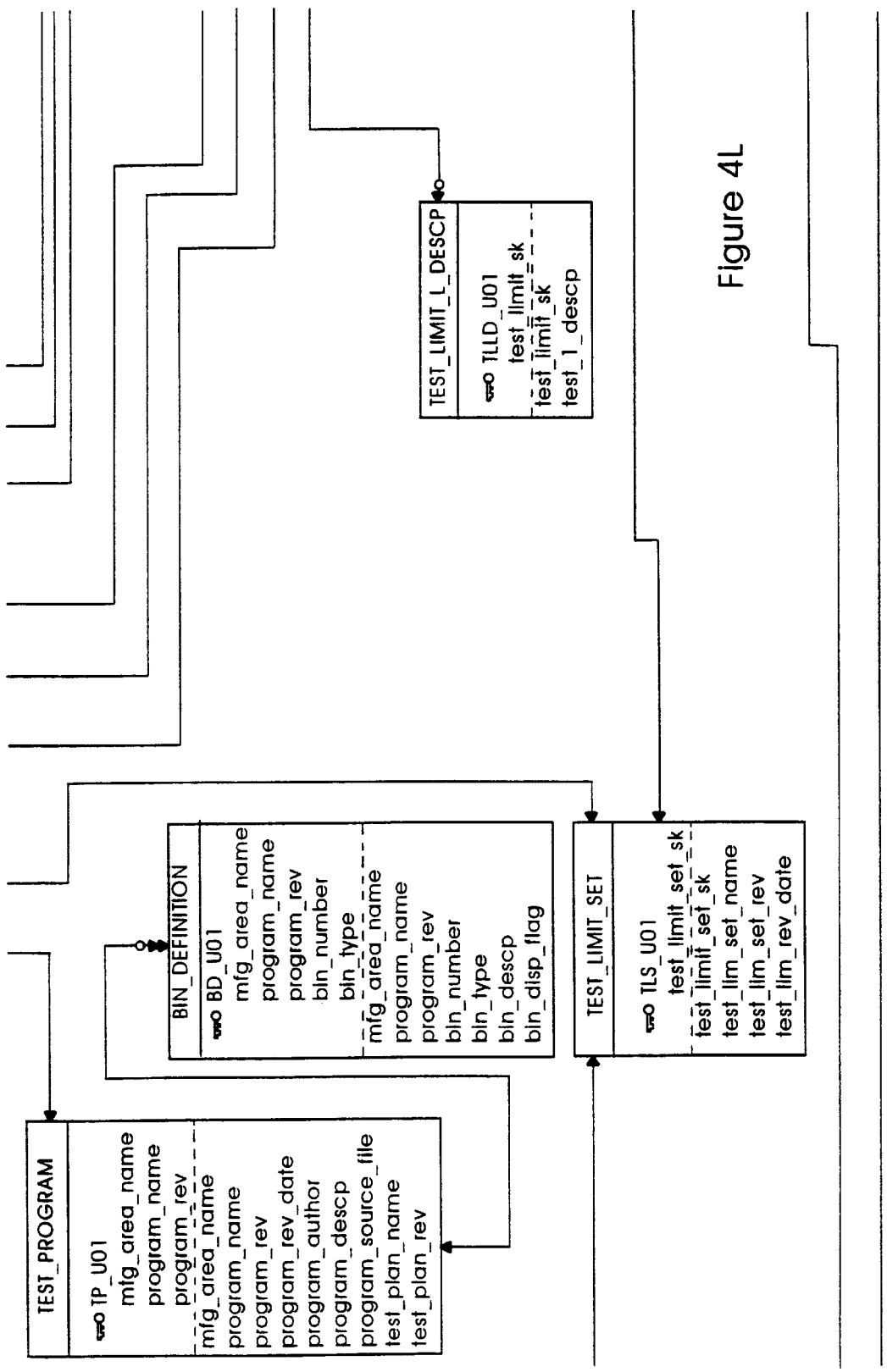
Figure 4M:
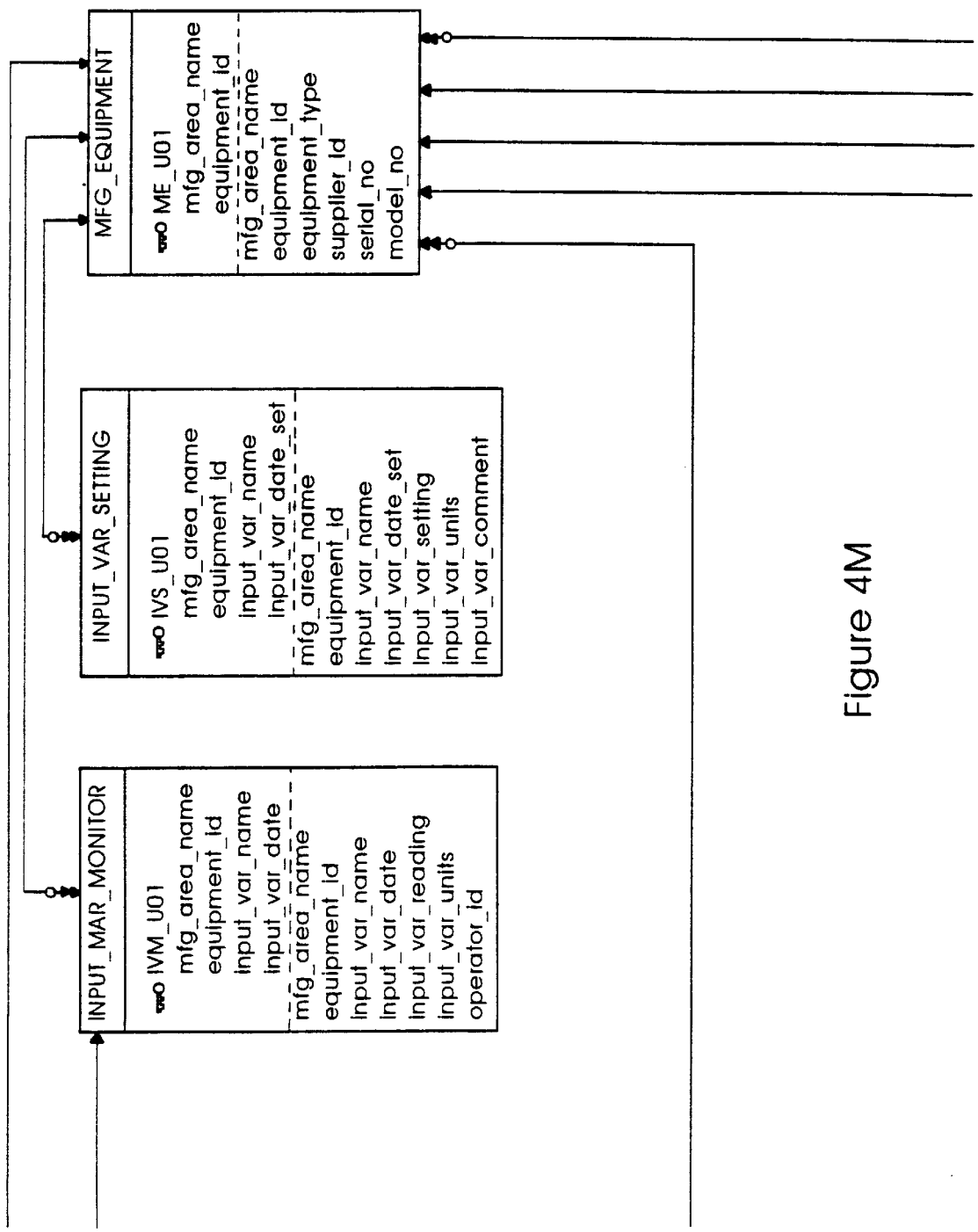
Figure 4N:
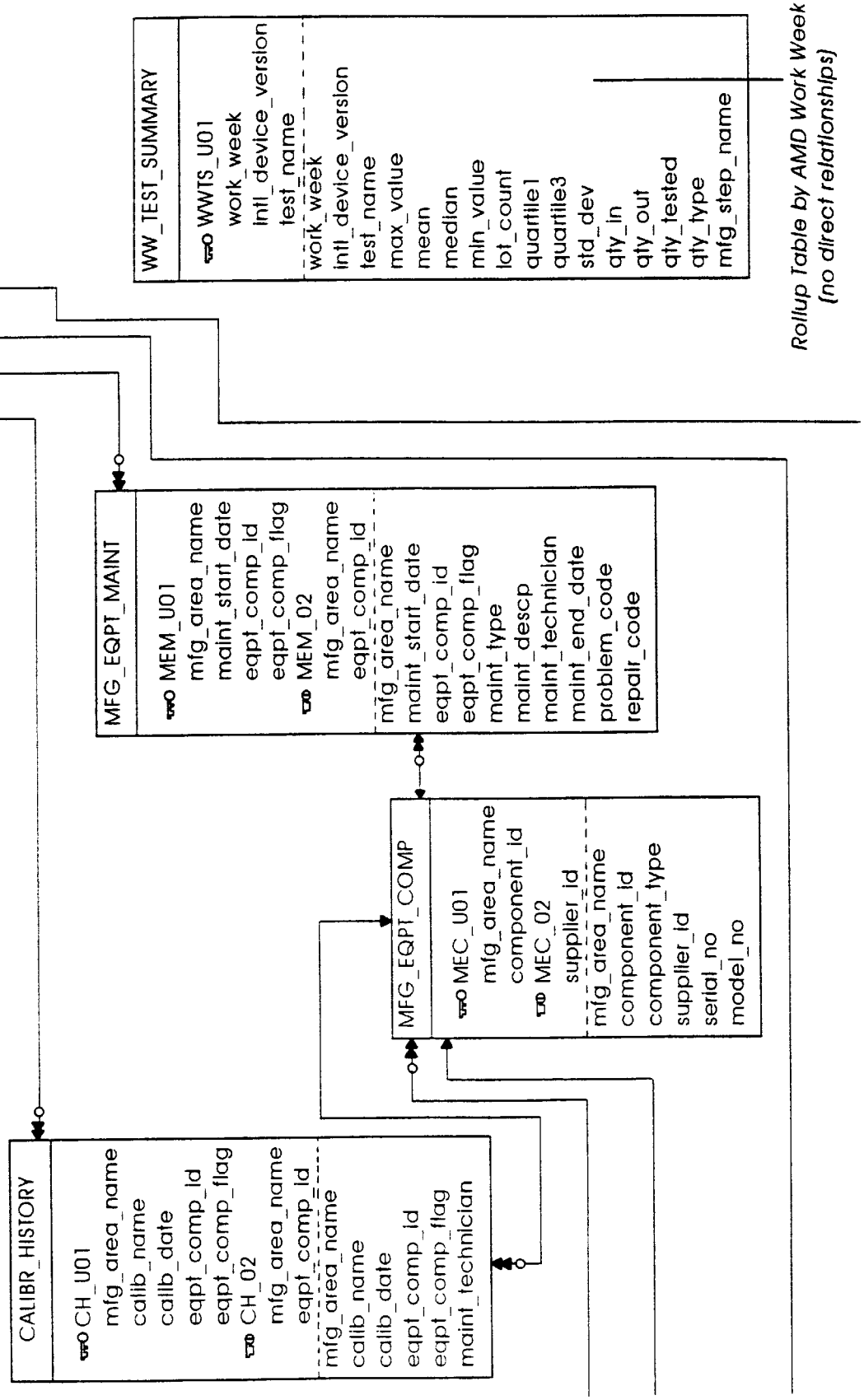
Figure 4P:
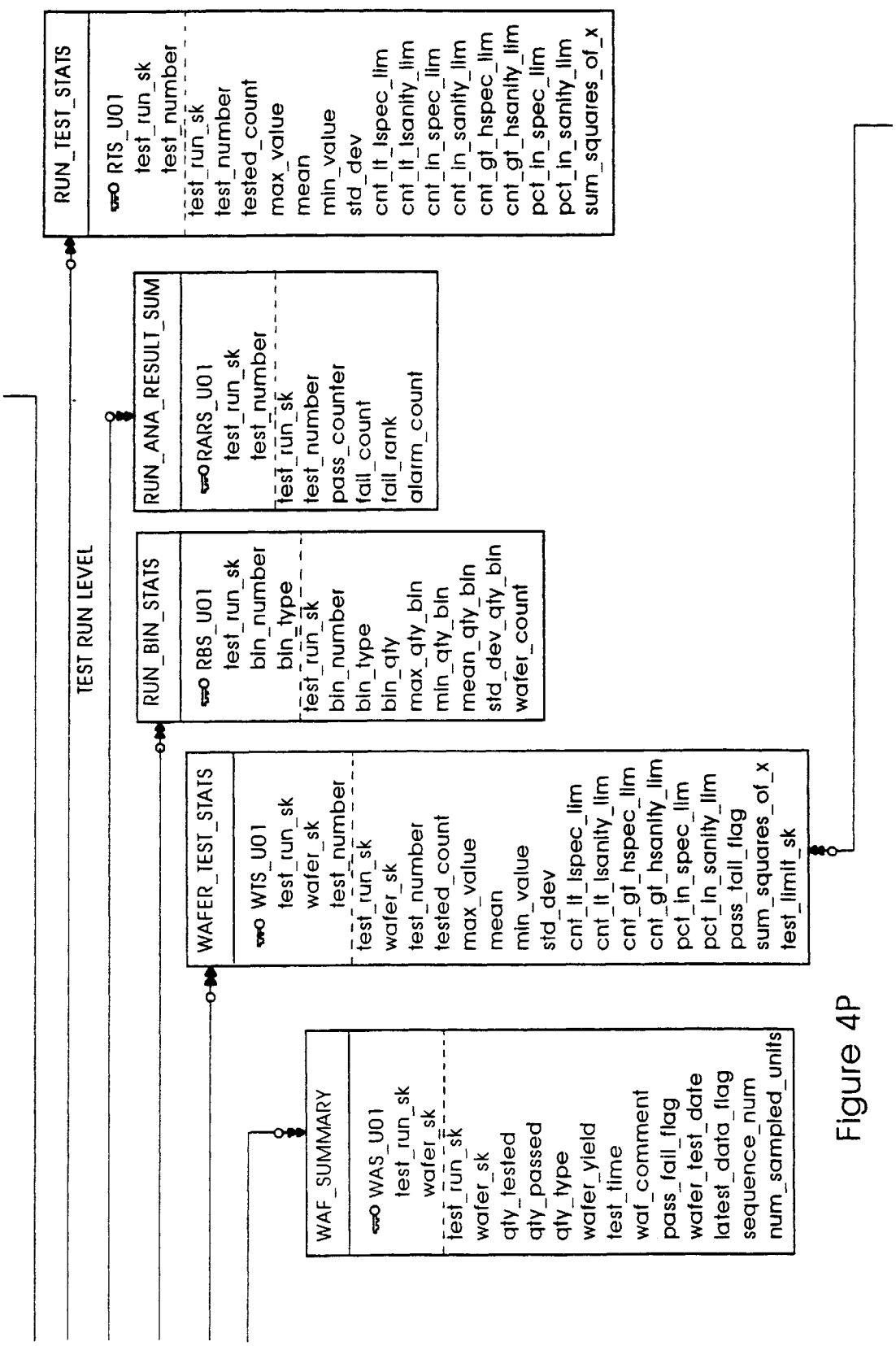
Figure 4Q:
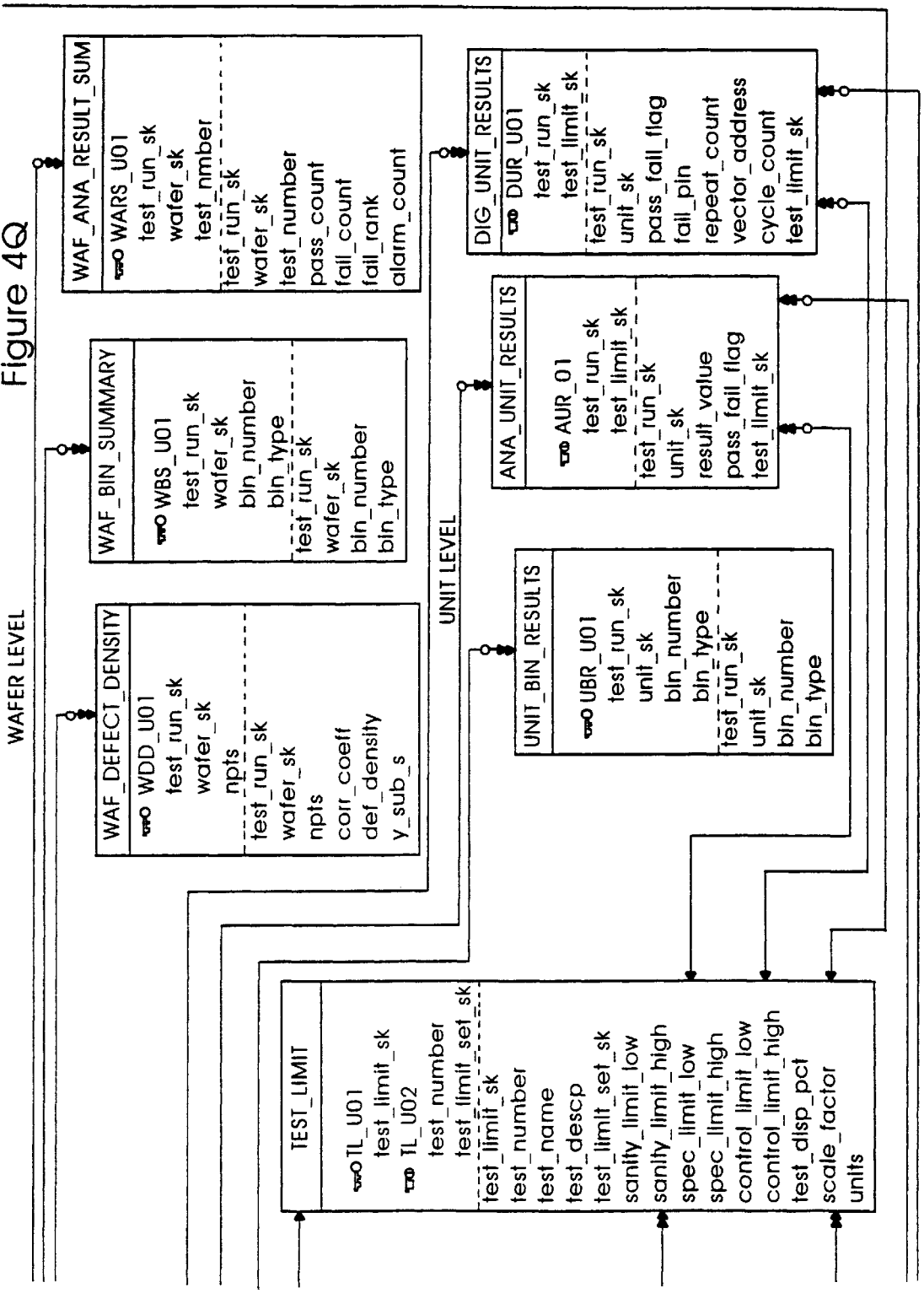

In FIG. 4A, the core table LOT is shown which contains the basic batch tracking entity. The LOT GENEALOGY TREE table tracks the various splits and submerges of lot numbers and enables the lot tracing capability. Data is added to this table on demand by a client request. For example, if a client requests a lot trace, either forward or backward from a particular point in the manufacturing process, a request goes from the client to application software designed in accordance with the present invention in database server 105. The software runs a routine designed in accordance with the present invention against the two tables and from that summarizes and proves a list of all nodes in the genealogy trees and all of the links between the nodes as shown in FIG. 3. This information is essentially transient, created on demand and purged periodically. The LOT tables contain the core information for the relationship between the lot as an entity and its history in terms of various transactions that have happened to the lot as it splits and merges in the production process.

Other tables are fairly static. For example, the PRODUCT and PRODUCT ATTR (attribute) tables contain model numbers and attributes of various products, which as described above, may change, for example, on a yearly basis.

In FIGS. 4A–D, most of the tables are interconnected with a number of lines, each with an arrow of one of a number of different shapes. These lines and arrows represent relationships between the entities. Each entity comprises a data table within data model 400. The arrows and lines represent the relationship between these entities. A single arrow head indicates that there is a one element in that data table or entity corresponding to the other entity or data table. Two arrow heads indicate that there are a number of elements in a data table which correspond to the entity or data table at the other end of the connecting line. A circle, or zero, indicates that there are no elements in a data table corresponding to the data table at the other end of the connecting line. A line with only a zero at its end indicates that there is no entity relationship between two tables, and thus, for the sake of clarity, such lines are not shown. A zero combined with either a single or double arrow head indicates that there may be zero or one (single head) or more (double head) data elements corresponding to the connected entity.

For example, considering the LOT and LOT GENEALOGY tables shown in FIG. 4A, for every record or entry in the LOT GENEALOGY table, there is one associated entry (i.e., lot number) in the LOT table, as indicated by the single arrow head on the connecting line between the tables. Conversely, for every lot number in the LOT table, there may be a number of entries in the LOT GENEALOGY table (if a lot genealogy was performed as discussed above) or no entries (if no lot genealogy was performed) as shown by the two arrow heads and circle on the connecting line between the tables.

Similarly, the WAFER TO LOT table describes the relationship between the wafers and the lots. Wafers may be tracked individually and a unique identifier may be assigned to each wafer. A given wafer may belong to one or more lots, depending on what stage in processing the wafer is in. Since a lot may be made up of a number of wafers, each entry in the LOT table may correspond to a number (or none) of WAFER TO LOT entries. The WAFER table contains entries of each wafer number. For each WAFER TO LOT entry there may be a number of WAFER entries. The UNIT TO LOT and UNIT tables describe a similar relationship between the UNITs (i.e., individual chips sawed from the wafers) and the LOTS and WAFERS. For example, each WAFER entry may correspond to a number (or none) of corresponding UNITS entries.

The data model 400 of the present invention is flexible to accommodate changes in the process steps. For example, another row of data may be added to a table without changing the overall structure of the model.

In order to facilitate operation of the distributed database, a data distributor software application may be provided to distribute any source database table from a database server (e.g., 105) to any number of other target or destination database servers (e.g., 107) throughout worldnet network 111. The entire contents of a database table or a subset of that table may be replicated from a local database server (e.g., 105) to any number of remote database servers (e.g., 107). The data distributor software application may facilitate the operation of several function of the distributed database system, particularly for manipulating and outputting data into report formats for clients.

For example, the client servers 108, 109, 110, 111 and loaders 104 may require timely access to a subset of the distributed database. For example, a lot genealogy for front to back lot traceability (as shown in FIG. 3) may require data elements from a plurality of database servers 105, 107 in the distributed database. Similarly, lot-based engineering summary data, which may be provided to improve communications between different manufacturing locations may require data elements from several database servers 105, 107. Standard worldwide database table joins may not provide the necessary performance characteristics required by some of these applications.

Figure 5:
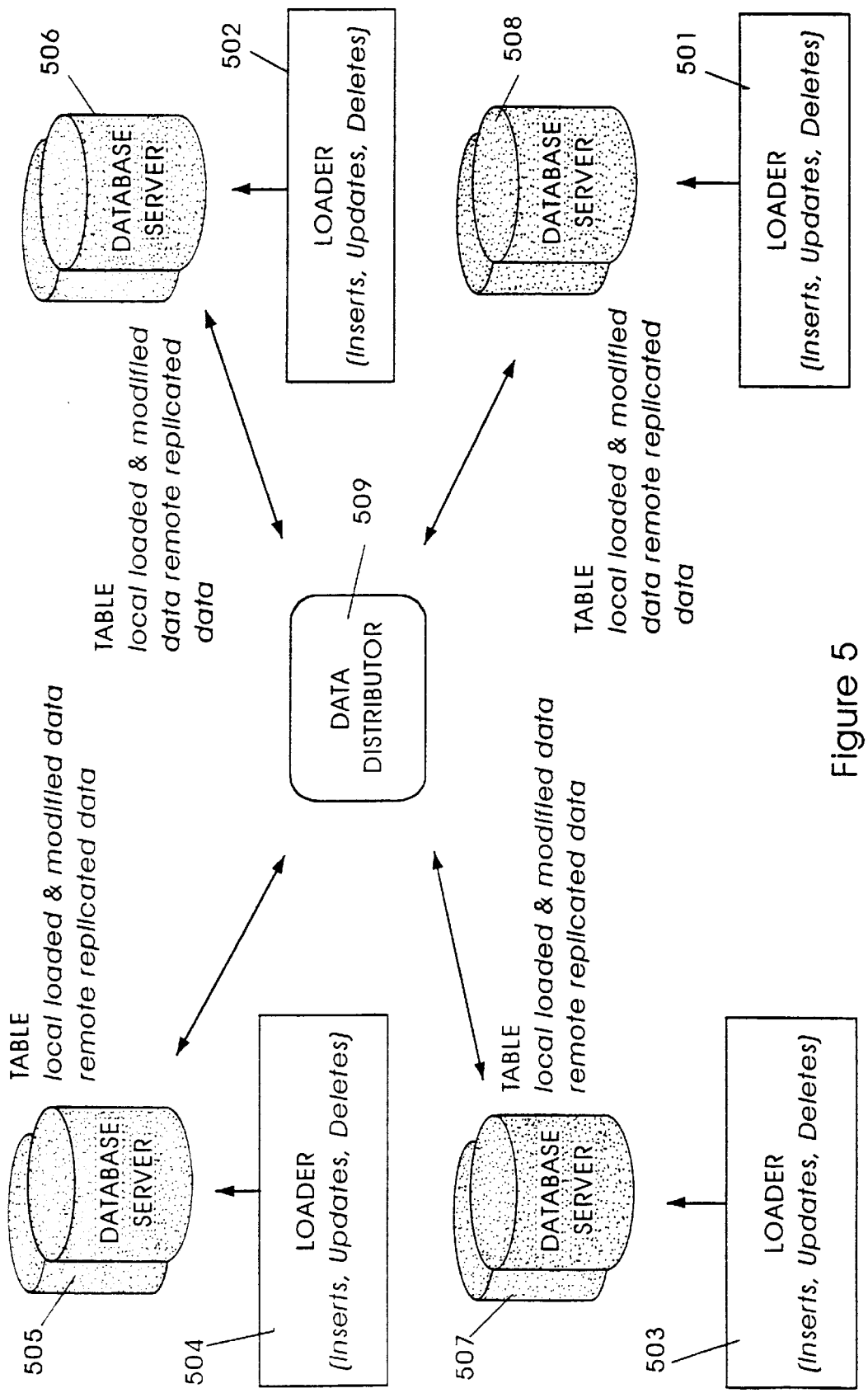
FIG. 5 is a block diagram illustrating the relationship between the data distributor and database servers within the distributed database of the present invention.

FIG. 5 is a block diagram illustrating the relationship between data distributor 509 and database servers 505, 506, 507, and 509 within the distributed database of the present invention. The use of data distributor 509 improves application performance by reducing the requirement for data access across remote sites by subsetting the remote data and replicating it locally. Further, data distributor serves to reduce network traffic during an application's run time and increases control over the timing of network transfers, for the better overall utilization of network resources. Data distributor 509 also serves to provide a redundant data source, and thus eliminate some points of system failure. If one portion of the distributed database is down (e.g., for maintenance, repair, or for data loading) client application programs may still be run if the necessary data has been replicated by data distributor 509.

Figure 6:
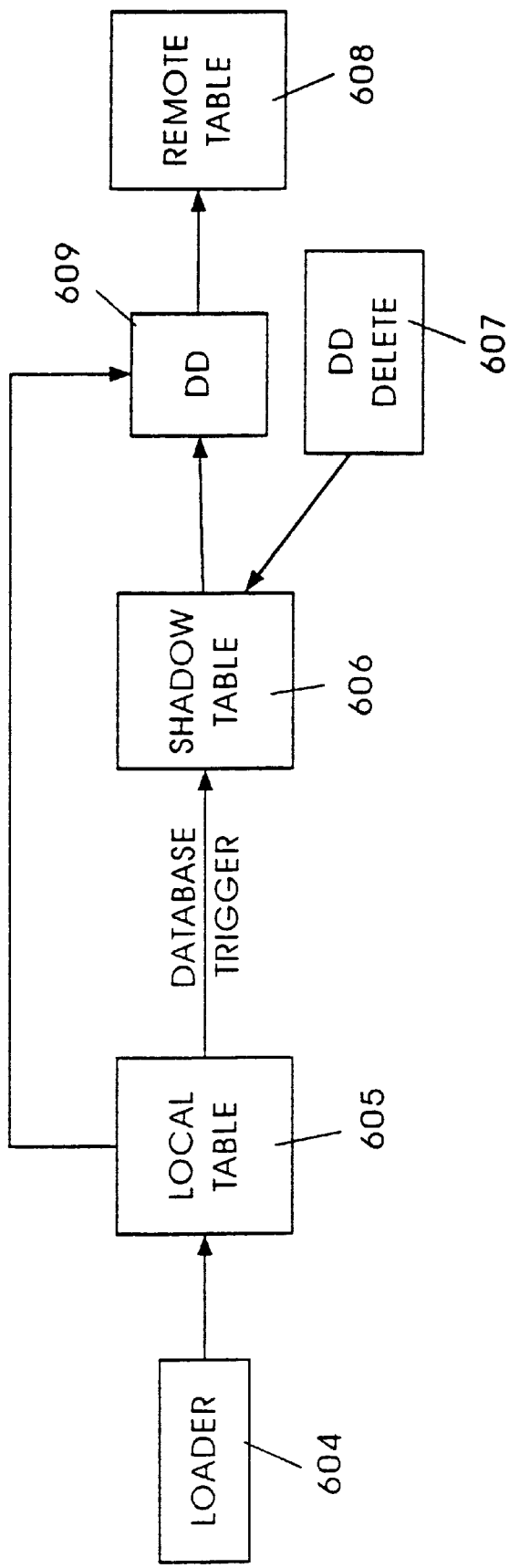
FIG. 6 is a block diagram of the architecture of the data distributor of FIG. 5.

FIG. 6 is a block diagram of the architecture of data distributor 509 of FIG. 5. Loader 604 represents any loader 501–504 within the distributed database. Similarly, local table 605 represents any local database server 505, 506, 507, 509 within the distributed database. Coupled to local table 605 is a shadow table 606, which may shadow the contents of local table 605. Local table 605 and Shadow table 606 are coupled to data distributor 609, which in turn is coupled to a remote table 607. Remote table 607 may represent any other database server within the distributed database system.

Data distributor 609 is designed to dynamically learn which data should be replicated, and to which destinations such data should be replicated to. Data distributor 609 is integrated into the client server query software and system data dictionary so as to learn which data should be replicated and to which remote databases the data should be replicated to. There are associated system costs involved with data replication. Data replication requires additional disk space, increases network traffic over worldnet 111, and requires additional CPU time. Thus, a balance must be struck between what data is needed frequently and associated data costs. Full replication of all data from each database within the distributed database to other databases would provide maximum client access to all data. However, such an approach would be unduly cost prohibitive. The data distributor of the present invention provides a balance between data cost and accessibility. Limited types of inquiries, such as lot summary and traceability data across sites, which may be used often by clients, may be selected for use with data distributor 609. Data supporting these inquiries may then be replicated so as to provide data redundancy and reduce client inquiry dwell time. Data distributor 609 determines which data from the data model shown in FIG. 4, and which related data elements should be transferred in response to a transfer request. If the integrity constraints of the data model shown in FIG. 4 are changed, data distributor 609 automatically "learns" to retrieve the correctly related data. In addition, data distributor 609 may be programmed to learn which data to replicate based upon other criteria, such as frequency of requests for particular data elements of the frequency of particular data queries (e.g., lot genealogy or the like).

Elements 604, 605, and 606 may be collectively referred to as the local source node, where the table requiring replication resides. Shadow table 606 is created to mirror source table (local table) 605 with additional data distributor application attributes. Database triggers on the source (local) table 605 capture and post all inserts, updates, and deletes (i.e., incremental changes) to the shadow table 606. The main program of data distributor 609 then executes to replicate a data configuration to predefined remote nodes, shown here as remote table (database) 608. An incremental run of database distributor 609 will replicate appropriate rows within shadow table 606. A full run of database distributor 609 will replicate all designated rows from source (local) table 605.

The data designator delete application program 607 will execute to clean up shadow table 606 after rows have been replicated successively. Remote table 608 comprises one or more destination table objects in a remote database server. More than one remote database server may be targeted, however, for the sake of illustration, only one remote table 608 is shown here. Changes from the local source node (604, 605, 606) may be transferred directly via database distributor 609 to the remote target table 608. Thus, data maintained at multiple sites throughout the distributed database is updated whenever incremental changes occur, or new data is entered.

Data distributor 609 has the ability to provide both incremental and full refreshes of database tables to remote site databases. replicating incremental changes dramatically reduces the overall volume of data transfers. Full refresh capability is provided to restore lost data, as well as for system initialization. Once a database has be suitably replicated using a full refresh, subsequent incremental refreshes should keep all replicated data current. The distributor mechanism of data distributor 609 comprehends the table dependencies shown in FIGS. 4A–D and distributes only those related rows from dependent tables.

The distributed database system of the present invention may receive a large amount of data from various sources on a daily basis. The amount of space available (on a disk drive or the like) may quickly be filled. Thus, in order to prevent the database from overrunning the capabilities of individual database servers, a database archiver (DA) is provided.

The database archiver is a software application which archives data from a local database based upon customizable options. The database archiver also provides for client requestable de-archival of data. De-archived data may be available to all clients throughout the distributed database in a transparent fashion, either through normal inquiries, or as updated by data distributor 609. In the preferred embodiment, archived data should be available to a client within twenty four hours after a request.

Figure 7:
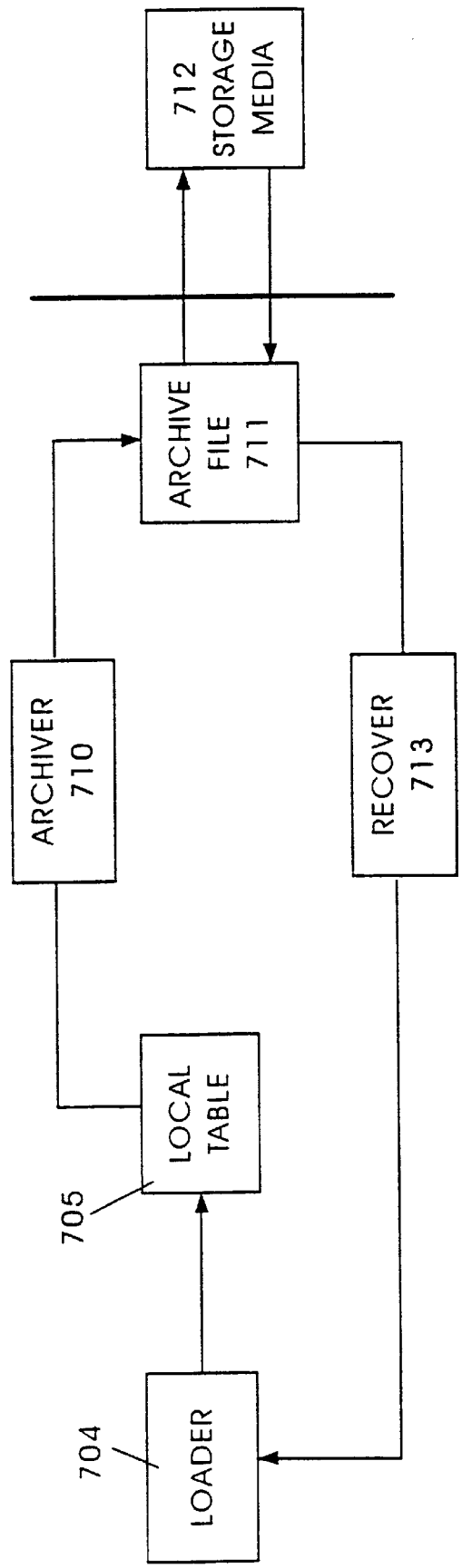
FIG. 7 is a block diagram showing the architecture of data archiver of the present invention.

FIG. 7 is a block diagram showing the architecture of data archiver of the present invention. Archiver 710 and recovery 713 are shown as separate elements in FIG. 7, however, the two may be combined into one application. Loader 704 and associated local table (database) 705 may comprise any local loader and database, for example, as shown in FIG. 5. For the purposes of illustration, only one loader 704 and local table (database) 705 are shown here.

Archiver 710 may archive data from local table 705 based upon one or more predetermined criteria. Lot level archives are triggered based upon the retention days of the data and the lot complete data (which is added to the LOT table). Non-lot based levels may be triggered based upon the retention days of the data and a defined level date. A lot complete data is defined as wither the date a lot of finished product ships from one area type to another (e.g., fabrication to packaging and final test) or the date at which the lot is moved out of a manufacturing step with a zero quantity. One a lot complete trigger has occurred, the data retention clock may be triggered. Thus, for example, data relating to a particular lot of semiconductor devices may be archived 60 days after the lot has left the fabrication step.

Archived data may be written out by archiver 710 into individual data files, one per lot, per level, shown as archive file 711 in FIG. 7. In this manner, the archived files may be reloaded into a database using the same loader 704 used to originally load the data. Archive file 711 is stored to and retrieved from a long-term secondary storage media 712, such as a magnetic tape or optical drive. The schema version (e.g., software version, database format and the like) is stored with the archived data such that later changes to the schema can be handled when retrieving archived data.

To retrieve archived data, a client may initiate a de-archive request from a lot status screen in the client graphical user interface run on client server 108, 109, 110, 112. Data level de-archive requests are then entered in a de-archival queue. Within twenty-four hours, a job will run which scans the de-archive queue to determined which data to return to the database. The de-archival program determines the current schema version, and build the appropriate loader control files necessary to reload the data. De-archived data may remain in the database for a defined period of time (e.g., 30 days) depending on the type of data (level). The client may be notified by electronic mail when the requested data has been de-archived.

Although described above in terms of semiconductor manufacturing (the preferred embodiment) the present invention may also be applied to other process steps which generate large amounts of disparate data, without departing from the spirit and scope of the invention. Further, the database distributor and archiver of the present invention may be similarly applied to other types of distributed databases. Similarly, although the WorkStream™ CAM system is discussed here for the purposes of illustration, other data acquisition systems, databases, data acquisition systems, or data sources may be used without departing from the spirit and scope of the invention.

Further, other types of computers than those disclosed above may be used as client server interfaces without departing from the spirit or scope of the invention. Further, access to SAPPHiRE database 106 may also be achieved through a terminal connected directly to one of database servers 105, 107. Finally, although a graphical user interface (GUI) is disclosed as the preferred embodiment for the client server, other types of interfaces may also be used without departing from the spirit and scope of the present invention It will be readily seen by one of ordinary skill in the art that the present invention fulfills all of the objects set forth above. After reading the foregoing specification, one of ordinary skill will be able to effect various changes, substitutions of equivalents and various other aspects of the invention as broadly disclosed herein. It is therefore intended that the protection granted hereon be limited only by the definition contained in the appended claims and equivalents thereof.

What is claimed is:

1. A system for storing and retrieving data having a network including data in a predetermined format where the data is reformatted by a reformatter to produce reformatted data, the network coupled to a database wherein the reformatted data is loaded thereto via a loader, the network coupled to at least one client workstation and a front end server for receiving and processing database search requests, comprising at least one data archiver, coupled to said database, archiving at least a portion of the data stored in said database according to a predetermined archiving algorithm, and transferring archived data to an archive storage media.

2. A system of claim 1, further comprising at least one data distributor, coupled to said database and said network, for shadowing at least a portion of the data stored in said database according to a predetermined algorithm, and for transferring shadowed data over said network.

3. In a system of claim 2, wherein said shadowed data is received and stored by another database.

4. A system of claim 1, wherein said at least one data archiver stores schema data on said archive storage media accompanying said archived data.

5. A system of claim 4, further comprising at least one data de-archiver, coupled to said database, said at least one client workstation, and said archive storage media, for receiving de-archive requests from said at least one client workstation, and for retrieving at least a portion of the archived data and corresponding schema data stored on said archive storage media and transferring the archived data and the schema data to said loader.

6. A system of claim 5, wherein said loader receives said archived data and said schema data and reloads said archived data into said database.

7. A database system for storing and retrieving data having a network including data in a predetermined format where the data is reformatted by a reformatter to produce reformatted data, the network coupled to a plurality of database servers, each containing at least a portion of the data comprising a database, wherein the reformatted data is loaded thereto via a loader, at least one of said plurality of database servers arranged to receive said database search request, searches for the data in the at least one or more of said plurality of database servers and produce the data responsive to a database search request, the network coupled to at least one client workstation receiving the database search request, comprising at least one data archiver, coupled to said database, for archiving at least a portion of the data stored in said database according to a predetermined archiving algorithm, and transferring archived data to an archive storage media.

8. A database system of claim 7, further comprising a front end server, coupled to said at least one client workstation and said network, for receiving said database search request, partitioning said database search request according to the location of requested data and transmitting said partitioned search request to the at least one or more of said plurality of database servers.

9. A database system of claim 8, wherein said front end server is configured to receive resultant data responsive to said partitioned database search request from at least one of said plurality of database servers, reformat said resultant data into one of a predetermined number of predetermined data formats to produce reformatted resultant data and transmit said reformatted resultant data to said client server.

10. A database system of claim 7, further comprising at least one data distributor, coupled to at least one of said plurality of database servers and said communications network, for shadowing at least a portion of the data stored in said at least one of said plurality of database servers according to a predetermined algorithm, and for transferring shadowed data over said communications network.

11. A database system of claim 10, wherein said shadowed data is received and stored by another of said plurality of database servers.

12. A database system of claim 7, further comprising at least one data archiver, coupled to at least one of said plurality of database servers, for archiving at least a portion of the data stored in said at least one of said plurality of database servers according to a predetermined archiving algorithm, and for transferring archived data to an archive storage media.

13. A database system of claim 12, wherein said at least one data archiver stores schema data on said archive storage media accompanying said archived data.

14. A database system of claim 13, further comprising at least one data de-archiver, coupled to at least one of said plurality of database servers, said at least one client server, and said archive storage media, for receiving de-archive requests from said at least one client server, and for retrieving at least a portion of the archived data and corresponding schema data stored on said archive storage media, and transferring the archived data and the schema data to said at least one loader.

15. A database system of claim 14, wherein said loader receives said archived data and said schema data and reloads said archived data into said at least one of said plurality of database servers.

16. A method used in the manufacturing of a semiconductor device, comprising the steps of:
(a) collecting process data having a first prescribed format representing processing of a semiconductor material to form a semiconductor circuit, and collecting test data of a second prescribed format representing testing of the semiconductor circuit;
(b) reformatting said process data and said test data into a predetermined data format comprising at least one of the first prescribed format, the second prescribed format and another prescribed format to produce reformatted data; and
(c) loading said reformatted data into at least one database server to produce a database containing said reformatted data in the predetermined format.

17. The method of claim 16, further comprising the step of querying said database to produce a record of the production and testing of said semiconductor circuit.

18. The method of claim 17, further comprising the step of receiving said database search request, partitioning said database search request according to the location of requested data and transmitting said partitioned search request to the at least one or more of said plurality of database servers.

19. The method of claim 18, wherein said receiving step further comprises the steps of receiving resultant data responsive to said partitioned database search request from at least one of said plurality of database servers, reformatting said resultant data into one of a predetermined number of predetermined data formats to produce reformatted resultant data and transmitting said reformatted resultant data to said client server.

20. The method of claim 17, further comprising the step of shadowing at least a portion of the data stored in said at least one of said plurality of database servers according to a predetermined algorithm, and transferring shadowed data over said communications network.

21. The method of claim 20, wherein said shadowing step further comprises the step of receiving and storing the shadowed data by another of said plurality of database servers.

22. The method of claim 17, further comprising the step of archiving at least a portion of the data stored in said at least one of said plurality of database servers according to a prescribed archiving algorithm, and transferring archived data to an archive storage media.

23. The method of claim 22, wherein said archiving step further comprises the step of storing schema data on said archive storage media accompanying said archived data.

24. The method of claim 23, father comprising the steps of receiving de-archive requests from said at least one client server, retrieving at least a portion of the archived data and corresponding schema data stored on said archive storage media and transferring the archived data and the schema data to said at least one loader.

25. The method of claim 24, further comprising the steps of receiving said archived data and said schema data and reloading said archived data into said at least one of said plurality of database servers.

26. A method used in the manufacturing of a semiconductor device, comprising the steps of:
(a) collecting process data of a prescribed format representing processing of a semiconductor material to form a semiconductor circuit, and collecting test data of the prescribed format representing testing of the semiconductor circuit;
(b) reformatting said process data and said test data into a predetermined data format to produce reformatted data; and
(c) loading said reformatted data into at least one database server to produce a database containing said reformatted data in the predetermined format.

27. A method used in the manufacturing of a semiconductor device, comprising the steps of:
(a) collecting process data of a first prescribed format representing processing of a semiconductor material to form a semiconductor circuit, and collecting test data of a second prescribed format representing testing of the semiconductor circuit;
(b) reformatting said process data and said test data into a predetermined data format to produce reformatted data; and
(c) loading said reformatted data into at least one database server to produce a database containing said reformatted data in the predetermined format.

28. A system for use in the manufacturing of a semiconductor device, comprising:
means for collecting process data having a prescribed format representing the processing a semiconductor material to form a semiconductor circuit, and for collecting test data of the prescribed format representing the testing of the semiconductor circuit;
means for reformatting said process data and said test data into a predetermined data format to produce reformatted data; and
means for loading said reformatted data into at least one database server to produce a database containing said reformatted data in the predetermined format.

29. A system for use in the manufacturing of a semiconductor device, comprising:
means for collecting process data having a first prescribed format representing processing of a semiconductor material to form a semiconductor circuit, and for collecting test data having a second prescribed format representing testing of the semiconductor circuit;
means for reformatting said process data and said test data into a reformatted data format to produce reformatted data; and
means for loading said reformatted data into at least one database server to produce a database containing said data in the reformatted format.

* * * * *